(12) United States Patent
Arkhipov et al.

(10) Patent No.: US 9,563,737 B1
(45) Date of Patent: Feb. 7, 2017

(54) METHOD, SYSTEM, AND COMPUTER PROGRAM PRODUCT FOR CHECKING OR VERIFYING SHAPES IN TRACK PATTERNS FOR ELECTRONIC CIRCUIT DESIGNS

(71) Applicant: Cadence Design Systems, Inc., San Jose, CA (US)

(72) Inventors: Alexandre Arkhipov, San Jose, CA (US); Jeffrey Markham, San Jose, CA (US); Karun Sharma, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 94 days.

(21) Appl. No.: 14/318,488

(22) Filed: Jun. 27, 2014

Related U.S. Application Data

(60) Provisional application No. 61/973,224, filed on Mar. 31, 2014.

(51) Int. Cl.
  *G06F 9/455* (2006.01)
  *G06F 17/50* (2006.01)
(52) U.S. Cl.
  CPC .................. *G06F 17/5081* (2013.01)
(58) Field of Classification Search
  USPC ......................................................... 716/112
  See application file for complete search history.

(56) References Cited

U.S. PATENT DOCUMENTS

| | | | |
|---|---|---|---|
| 5,598,343 A | 1/1997 | Roy | |
| 5,793,643 A | 8/1998 | Cai | |
| 8,316,326 B1 | 11/2012 | Pierrat | |
| 8,607,183 B2 | 12/2013 | Meizner | |
| 8,707,223 B2 | 4/2014 | Blatchford | |
| 8,782,570 B1 | 7/2014 | Li | |
| 8,871,104 B2 | 10/2014 | Park | |
| 9,141,751 B2 | 9/2015 | Lee | |
| 9,158,885 B1 | 10/2015 | Gray | |
| 2002/0069396 A1* | 6/2002 | Bhattacharya | G06F 17/5045 716/102 |

(Continued)

OTHER PUBLICATIONS

Non-Final Office Action dated May 28, 2015 for U.S. Appl. No. 14/292,166.

(Continued)

*Primary Examiner* — Bryce Aisaka
(74) *Attorney, Agent, or Firm* — Vista IP Law Group, LLP

(57) ABSTRACT

Methods and systems for checking or verifying shapes in electronic designs are disclosed. The method identifies a dictionary (if pre-existing) or determining the dictionary by creating the dictionary and reduces dimensionality of design data by using a sliced line. Shapes are transformed into sliced line segments along the sliced line. Dictionary entries for shapes are associated with corresponding sliced line segments, and the design is checked or verified using the sliced line segments and the associated dictionary entries rather than using two-dimensional shapes or geometric data. Sliced line segments may be further partitioned or merged. Non-conforming shapes corresponding to no tracks of track patterns are identified and determined whether violations of design rules or requirements may be resolved by one or more other shapes using the corresponding sliced line segments.

28 Claims, 21 Drawing Sheets

(56) References Cited

U.S. PATENT DOCUMENTS

2003/0005399 A1* 1/2003 Igarashi .............. G06F 17/5068
                                                          716/119
2008/0028352 A1  1/2008 Birch et al.
2011/0014786 A1  1/2011 Sezginer
2015/0234974 A1  8/2015 Dechene

OTHER PUBLICATIONS

Final Office Action dated Oct. 28, 2015 for U.S. Appl. No. 14/292,166.
Notice of Allowance dated Feb. 8, 2015 for U.S. Appl. No. 14/292,122.
Notice of Allowance dated Mar. 15, 2016 for U.S. Appl. No. 14/292,166.
Non-Final Office Action dated Mar. 29, 2016 for U.S. Appl. No. 14/231,688.
Non-Final Office Action dated Jul. 28, 2016 for U.S. Appl. No. 14/675,426.
Final Office Action dated Oct. 27, 2016 for U.S. Appl. No. 14/231,688.

* cited by examiner

METHOD, SYSTEM, AND COMPUTER PROGRAM PRODUCT FOR CHECKING OR VERIFYING SHAPES IN TRACK PATTERNS FOR ELECTRONIC CIRCUIT DESIGNS

CROSS REFERENCE TO RELATED APPLICATION(S)

This application claims the benefit of U.S. provisional patent application Ser. No. 61/973,224 filed on Mar. 31, 2014 and entitled "METHOD, SYSTEM, AND COMPUTER PROGRAM PRODUCT FOR CHECKING OR VERIFYING SHAPES IN TRACK PATTERNS FOR ELECTRONIC CIRCUIT DESIGNS". This application is related to U.S. patent application Ser. No. 14/231,688 entitled "METHOD, SYSTEM, AND COMPUTER PROGRAM PRODUCT FOR IMPLEMENTING TRACK PATTERN SYNTHESIS FOR ELECTRONIC CIRCUIT DESIGNS" and filed on Mar. 31, 2014 and U.S. provisional patent application Ser. No. 61/973,226 entitled "METHOD, SYSTEM, AND COMPUTER PROGRAM PRODUCT FOR IMPLEMENTING TRACK PATTERNS FOR ELECTRONIC CIRCUIT DESIGNS" and filed on Mar. 31, 2014. The content of the aforementioned U.S. patent application and U.S. provisional patent applications is hereby expressly incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

In an effort to deal with and simplify otherwise extremely complex design rules at advanced process rules, foundries are now turning to a different approach in which routing regions of a design on any particular metal layer are performed only on a set of specific metal tracks, each of which may only take on width values from a discrete set of legal widths that may be made available in the process Design Rule Manual (DRM). Furthermore, in order to facilitate self-aligned double patterning (SADP) processes and deal with mask designation issues, additional constraints may be created by which track widths may be selected. For example, after a first track is chosen and assigned a mask color (e.g. B for Blue), the next track may need to be assigned a different color (e.g., C for Cyan), and may only take one of a discrete set of legal width values, where that set in turn is a function of the preceding B track width.

An electronic design may also correspond to and thus include more than ten different size wires, and the tracks for the electronic design may thus be associated with as many legal widths. Any attempt to manually figure out which track associated with a given width may be immediately neighboring another track associated with a given width is nearly impossible due to the sheer number of different possible legal combinations of tracks, especially in light of the extremely complex design rules that govern what track patterns are legal. In addition or in the alternative, an electronic design may be required to include some pre-seeded track patterns. Therefore, generating a legal track pattern including a plurality of tracks associated with some legal widths is nearly impossible to be performed manually, especially when an electronic design includes more than a few legal or permissible widths. The interplay between the complex design rules for modern electronic designs and the multiplicity of legal track patterns have rendered design rule checks or verification a more tedious task than ever.

Therefore, there exists a need for effective and efficient techniques to implement track pattern for electronic circuit designs.

SUMMARY

Disclosed are method(s), system(s), and article(s) of manufacture for checking or verifying shapes in an electronic design in one or more embodiments. Some embodiments are directed at a method for checking or verifying shapes in an electronic design. These methods may use a computer to execute a sequence of instructions to perform a process that identify or determine a dictionary for an electronic design. The method further identifies or determines a sliced line for a region in the electronic design to reduce dimensionality of design data in the region. Various shapes in the region are checked or verified to identify one or more non-conforming shapes based at least in part upon the sliced line. The method identifies or determines sliced line segments by using the shapes in the region. A sliced line segment may be further partitioned into multiple sliced line segments by processing one or more additional shapes. Multiple sliced line segments may be merged if these multiple sliced line segments are determined to be similar. The method may further dynamically check or verify a shape for compliance with one or more design rules by using the sliced line and the dictionary when the shape is being added, modified, or removed or before the shape is added, modified, or removed from the electronic design. The method identifies a shape as non-conforming by determining whether the shape corresponds to any track in a set of track patterns. A non-conforming shape is further checked to determine whether the non-conforming shape violates one or more other design rules. The method determines whether or not one or more other shapes may cure the non-conformance or violation of the one or more design rules caused by the non-conforming shape.

Some embodiments are directed at a hardware module or system that may be invoked to perform any of the methods, processes, or sub-processes disclosed herein. The hardware system may include a track pattern processing module, a track pattern database enumeration and maintenance module, an implementing option processing module, a track pattern generation module, and/or a track pattern evaluation module in some embodiments. The hardware system may further include one or more forms of non-transitory machine-readable storage media or devices to temporarily or persistently store various types of data or information such as the firmware. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for checking or verifying shapes associated with track patterns for electronic circuit designs are described below with reference to FIGS. 1-11.

BRIEF DESCRIPTION OF THE DRAWINGS

The drawings illustrate the design and utility of various embodiments of the invention. It should be noted that the figures are not drawn to scale and that elements of similar structures or functions are represented by reference numerals throughout the figures. In order to better appreciate how to obtain the above-recited and other advantages and objects of various embodiments of the invention, a more detailed description of various embodiments briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments of the invention are directed to a methods, systems, and articles of manufacture for checking or verifying shapes associated with track patterns for electronic circuit designs. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of various embodiments described herein. Where certain elements of some embodiments may be partially or fully implemented using known components (or methods or processes), only those portions of such known components (or methods or processes) that are necessary for an understanding of various described embodiments will be described, and the detailed descriptions of other portions of such known components (or methods or processes) will be omitted so as not to obscure the invention. Further, various embodiments encompass present and future known equivalents to the components referred to herein by way of illustration.

Figure 1:
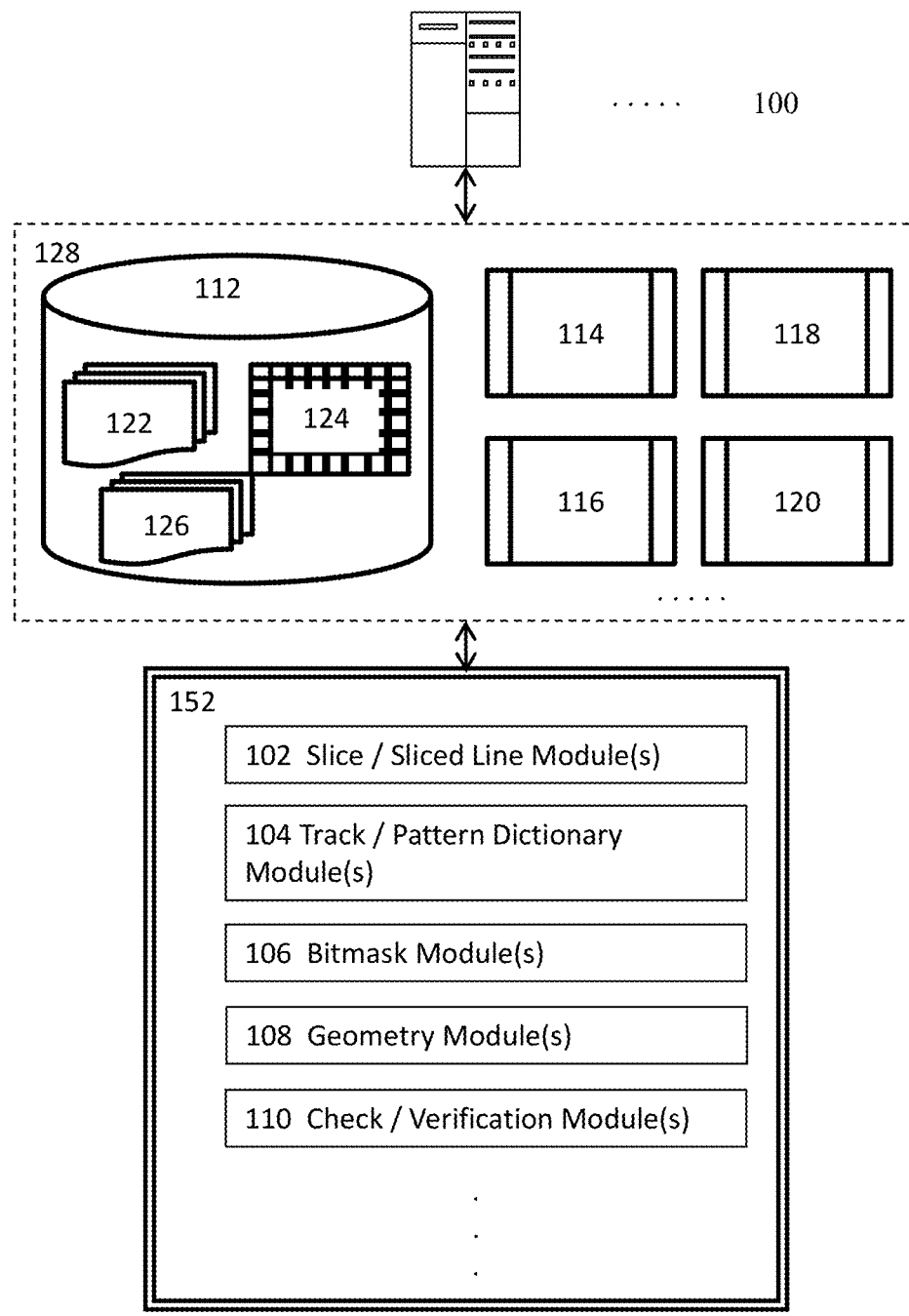
FIG. 1 illustrate a illustrative high level schematic block diagrams for a system for checking or verifying shapes associated with track patterns for electronic circuit designs in some embodiments.

Disclosed are method(s), system(s), and article(s) of manufacture for checking or verifying shapes associated with track patterns for electronic circuit designs in one or more embodiments. FIG. 1 shows an illustrative high level schematic block diagrams for a method or system for checking or verifying shapes associated with track patterns for electronic circuit designs. In one or more embodiments, FIG. 1 illustrates an illustrative high level schematic block diagrams for checking or verifying shapes associated with track patterns for electronic circuit designs and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a floorplanner, a global routing engine, and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), electronic circuit design specification database(s), various statistics, various data, rule decks, various design rules, constraints, etc. (122), or other information or data (126) that may be used to facilitate the performance of various functions to achieve the intended purposes.

In some embodiments, the one or more computing systems 100 may, either directly or indirectly through various resources 128 to invoke various software, hardware modules or combinations thereof 152 that may comprises one or more slice or sliced line modules 102 to insert, remove, modify, or otherwise operate upon one or more slices and/or to create, update, modify, or otherwise operate upon one or more sliced lies for one or more electronic designs, one or more track or pattern dictionary modules 104 to create, update, modify, or otherwise perform various operations on one or more dictionaries for shapes and/or patterns in electronic designs, one or more bitmask modules 106 to generate, remove, or modify one or more sliced line segments for various shapes and/or track patterns, one or more geometry modules 108 to extract, modify, project, or otherwise perform various operations on shapes in electronic designs, and one or more check or verification modules 110 to check or verify shapes or patterns against various design rules, performance objectives, manufacturing requirements, or other constraints.

A routing track or simply a track (hereinafter a "track") includes a one-dimensional fictitious line or line segment derived from the manufacturing grids provided by foundries. A routing track thus having zero width in physical designs (e.g., a layout of an electronic design) and is used to guide physical implementation tools (e.g., floorplanner, placement tools, or routing tools) to implement the physical design for an electronic design. For example, a routing tool may lay the centerline of a wire segment along a routing track during the routing process. A routing track may nonetheless be associated with a width to indicate that the particular routing track is to be used to route wires having the associated width. A track pattern is a collection of one or more tracks associated with their respective widths of the shapes (e.g., wire segments) that are to be implemented along these one or more tracks.

A track pattern is considered legal if the collection of one or more tracks in the track pattern complies with various design rules governing which arrangements or sequences of track associated with their respective widths are permitted. For example, a design may prohibit arranging a thin wire segment having a width of $w_1$ immediately adjacent to a thick or fat wire segment having a width of $w_2$ in any track pattern. Given this design rule, any track patterns having such an arrangement of two immediately neighboring tracks associated with $w_1$ with $w_2$ violate this design rule and will thus be considered illegal. A slice corresponds to a region (e.g., a cell, a block, or an area) that spans along a routing direction and may extend across the entire length in the other routing direction. In the context including a sliced line (see below), a slice may include multiple segments (e.g., sliced line segments) along the sliced line. In this context, a segment or a slice along a sliced line may comprises an object that may be used to traverse a container including, for example, lists, maps, a sliced line, etc. In these embodiments, a sliced line comprises a collection of ordered objects (e.g., the aforementioned "segments" or "slices").

A sliced line may include a line segment or a line by projecting the two boundaries of the region of interest perpendicular to a reference line with respect to the reference line. For example, the rectangular area 800 in FIG. 8A may represent a region, and line 850 may represent a sliced line. It shall be noted that the bottom boundary and the top boundary of the region 800 may be called period lines, each of which may be used as a reference line to determine a sliced line. For illustration purposes the sliced line 850 is shown offset from the bottom period line for clarity.

A segment may be formed along a sliced line when projecting the end points of a wire segment onto the sliced line. Such a segment between a start point and an end point, projected from a corresponding wire segment, along the sliced line may be called a sliced line segment. A sliced line segment may be obtained by projecting the line ends of a wire segment onto the slice line and thus may be associated with the absolute or relative coordinates of the start point indicating the beginning of the sliced line segment and the end point indicating the end point of the sliced line segment. A sliced line segment may be further divided into multiple, shorter sliced line segments. Multiple sliced line segments may also be merged into a longer, single sliced segment. The region situated between two dashed line segments 856 and 858 perpendicular to the routing direction (horizontal in FIG. 7) may be called a slice where these two vertical line segments may extend all the way to the upper period line of the region 800.

Figure 2:
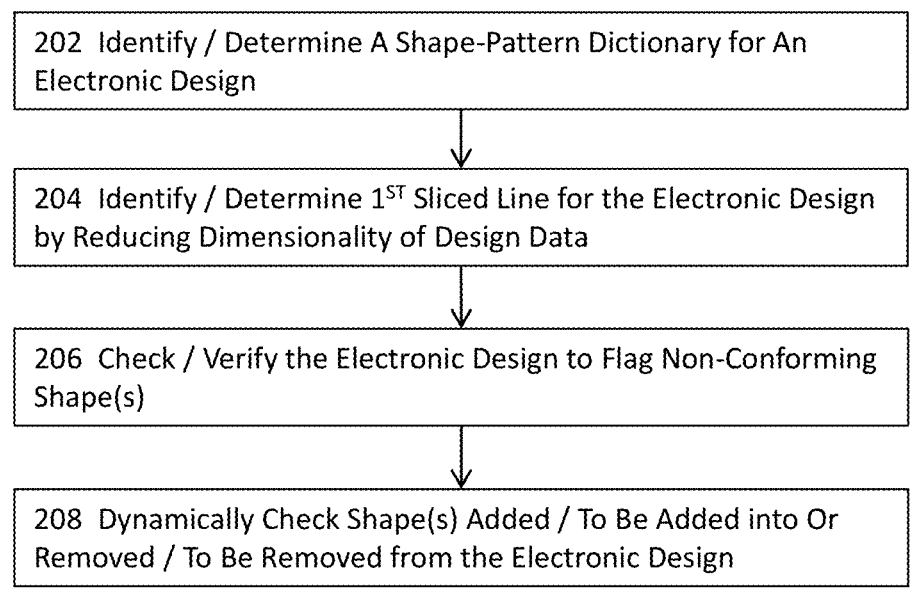
FIG. 2 illustrates a high level block diagram for a method or system for checking or verifying shapes associated with track patterns for electronic circuit designs in some embodiments.

FIG. 2 illustrates a high level block diagram for a method or system for checking or verifying shapes associated with track patterns for electronic circuit designs in some embodiments. In these embodiments illustrated in FIG. 2, the method or system may identify or determine a shape or pattern dictionary for an electronic design at 202. The shape or pattern dictionary may include numerous entries for various shapes in one or more electronic designs. For example, a shape or pattern dictionary may include entries for various shapes of an electronic design that is being checked or verified or for various other shapes of one or more prior electronic designs, some of which may be structurally or functionally similar to the electronic design that is being checked or verified. More details about a shape or pattern dictionary will be described in subsequent paragraphs with reference to FIGS. 6A-B. In some embodiments where an object (e.g., a dictionary for an electronic design) already exists, the method or system may identify the already existing object. For example, if the dictionary already exists in a non-transitory computer accessible storage medium for the electronic design of interest, the method or system may identify the dictionary from the non-transitory computer accessible storage medium. In some other embodiments where the object does not exist yet, the method or system may determine the object by creating the dictionary for the electronic design. For example, if the dictionary for an electronic design does not exist at or around the time when action 202 is performed or to be performed, the method or system may determine the dictionary by creating it.

At 204, the method or system may identify or determine a first sliced line for the electronic design. In some of these embodiments illustrated in FIG. 2, the method or system identifies or determines the first sliced line by reducing the original dimensionality of the design data to reduced dimensionality of the design data in at least the region of the electronic design, while still being able to check or verify the region without losing visibility of the original dimensionality. For example, the method or system may reduce two-dimensional shapes to one-dimensional data (e.g., data represented by a one-dimensional sliced line). Nonetheless, the method or the system may still use the one-dimensional data to perform design rule checks and verification on the region without referring to the data of the two-dimensional shapes while still being able to determine whether the one-dimensional data comply with various design rules governing the shapes in one dimension or in both dimensions.

A sliced line may include a line segment or a line by projecting the two boundaries of the region of interest perpendicular to a reference line with respect to the reference line. An illustrative sliced line may include, for example, one of the two boundaries or period lines (hereinafter period line or period lines) along the routing direction of the region where the reference line may include one of the two period lines along the routing direction. A sliced line may be sub-divided or partitioned into multiple sliced line segments by using multiple slices. A slice may correspond to a region (e.g., a cell, a block, or an area) that spans along a routing direction and may extend across the entire length in the other routing direction (e.g., wrong-way routing direction).

For example, a slice may include the area between the two vertical dashed lines 856 and 858 that may extend all the way to the top period line. A slice may be determined or identified by snapping lines perpendicular to the routing direction of a shape to the two end points of the shape. The intersection of these two lines with the sliced line or the projection of the two end points of the shape defines a sliced line segment or a vector for the slice. As will be described in greater details, a sliced segment may be further partitioned into multiple, shorter sliced line segments, and multiple sliced line segments may be merged into a longer sliced line segment.

At 206, the method or system may check or verify the electronic design against one or more design rules including, for example, various design rules governing the legality of track patterns, shape patterns, or wire patterns (collectively "patterns" hereinafter) associated with respective widths, various design rules governing multiple exposure, design rules controlling photomask designations, design rules governing how shapes may be designed in electronic designs, etc. The method then identify one or more non-conforming shapes by checking or verifying the electronic design using at least the sliced line and/or the dictionary. Various checks and verifications may be performed in a batch mode or dynamically in a substantially real-time manner. Nonetheless, it shall be noted that the manipulation may trigger one or more processes or may invoke one or more modules to perform various functions in order to generate the response to the manipulation, and that the triggering of the one or more processes or the invocation of various modules may take certain time to complete.

The method or system thus reduces the dimensionality of the design data (e.g., two-dimensional shapes or geometric data) by identifying, determining, and maintaining the sliced line that comprises multiple sliced line segments corresponding to a plurality of shapes in the design. Dictionary entries for shapes in the electronic design may be associated with corresponding sliced line segments. The method then uses the sliced line including multiple sliced line segments to check and verify the electronic design. Because the method needs only to process reduced dimensionality data (e.g., the sliced line segments) for design rule check and verification, the design rule check and verification may thus be performed in a much more efficient manner within a much shorter runtime.

Although the sliced line and its sliced line segments include reduced dimensionality design data, the method or system can nevertheless perform various design rule checks and verification in multi-dimensional aspects by using the reduced dimension sliced line and sliced line segments. For example, any end-of-line rule (e.g., line end spacing rules) may be quickly checked by using the sliced line or the sliced line segments. As another example, the method may simply compare or perform simple arithmetic operations on the end points of two overlapping shapes to determine whether or not the overlap satisfies a keep-out rule which requires a permissible range of overlap for two overlapping, immediately neighboring wire segments. This check or verification may be performed along the dimension of the sliced line.

The sliced line represents a one-dimensional representation of various shapes in a two-dimensional design. To determine the two-dimensional spatial relationship between two two-dimensional shapes in the two-dimensional design, the method may leverage the dictionary entries associated with the sliced line segments of these two shapes as well as the sliced line segments or slices to capture the two-dimensional spatial relationship between these two shapes with the one-dimensional sliced line. For example, the associated dictionary entry provides a distances or offsets of both edges the corresponding shape to a reference basis, a distance to an edge and a width of the corresponding shape, or any other geometric information that is appropriate to locate the shape along an axis that is not captured by the sliced line. Therefore, by using the slices or sliced segments together with the associated dictionary entries, the method may be made aware of the relative or absolute position in the direction orthogonal to the direction of the sliced line, without having to manipulate the more complex two-dimensional shapes or geometric data of the shapes.

At 208, the method or system may also dynamically check or verify shapes that are added or to be added into or removed or to be removed from the electronic design. In these embodiments, the checks or verification of a shape may be performed either after the fact after the shape has been added to or removed from the electronic design, at the time the shape is being added to or removed from the electronic design, or even before the shape is added to or removed from the electronic design. For example, a user may indicate that a new wire segment is to be inserted at or near a location in a region of an electronic design. The method or system described herein may perform various checks or verification on the wire segment to determine whether the new wire segment complies with design rules and provide feedback to the user after the new wire segment has been inserted, at the time the new wire segment is being inserted, or even before the wire segment is added. Therefore, the method or system provides an interactive checking and verification environment to the user so the user may be made aware of the effects of inserting this new wire segment.

Figure 3:
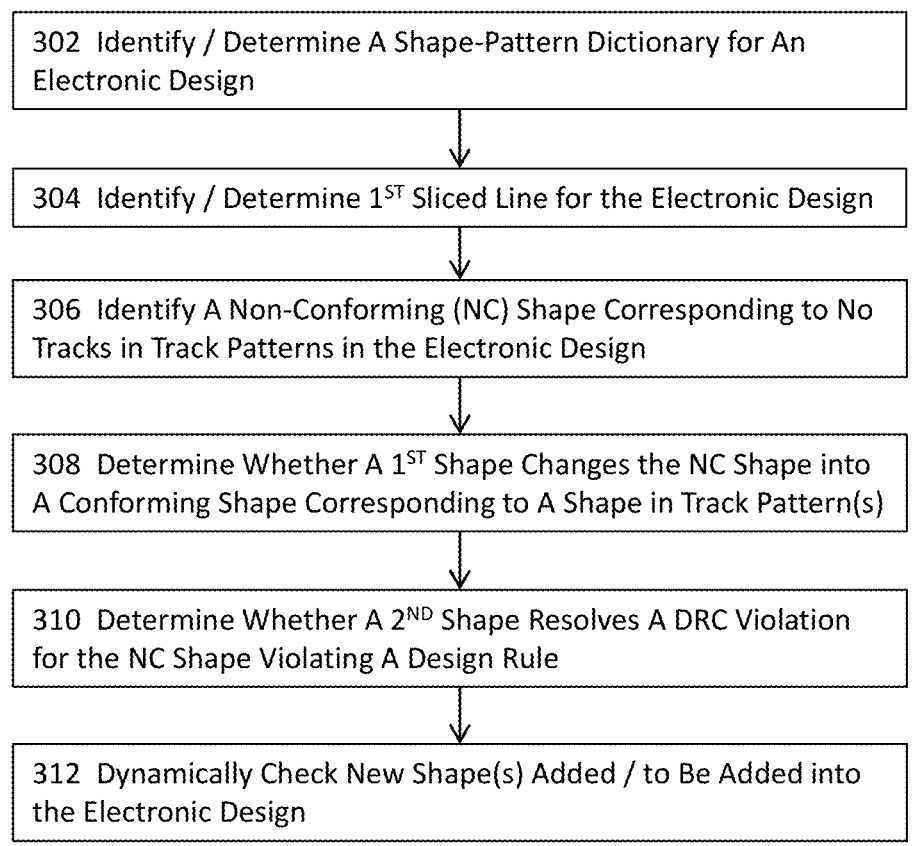
FIG. 3 illustrates a more detailed level flow diagram for a method or system for checking or verifying shapes associated with track patterns for electronic circuit designs in some embodiments.

FIG. 3 illustrates a more detailed level flow diagram for a method or system for checking or verifying shapes associated with track patterns for electronic circuit designs in some embodiments. In these embodiments illustrated in FIG. 3, the method or system may identify or determine a shape or pattern dictionary, symbol table, or database (collectively "dictionary" or "shape or pattern dictionary" hereinafter) for the electronic design. A dictionary includes a data structure that associates a value with a key in some embodiments. A dictionary may support operations including insertion of new keys or values into the dictionary as well as searches or queries for a value associated with a particular key. In some embodiments, a dictionary includes a key that is a combination of a width of a shape and an offset or distance of the shape to a reference line (e.g., a period line). In these embodiments, the aforementioned key includes a compound key. The offset may be determined from any reference geometries associated with the shape. For example, an offset of a shape may be the shortest distance from an edge, a vertex, or a centerline of the shape to a reference basis (e.g., a period line). In this application, the terms "offset" and "distance" may be used interchangeably, unless otherwise specifically recited or claimed. Moreover, a value associated with a key includes the identification a set of one or more legal track patterns or a set of legal combinations of widths associated with corresponding tracks in some embodiments. If there is not legal track patterns or legal combinations of widths associated with corresponding tracks, the value may comprise or correspond to an empty set. More details about a shape or pattern dictionary will be described in subsequent paragraphs with reference to FIGS. 6A-B. At 304, a first sliced line may be identified or determined for the electronic design. More details about a sliced line will be described in subsequent paragraphs with reference to FIGS. 4A-C. At 306, the method or system may identify a non-conforming shape that corresponds to no tracks in any track patterns in the electronic design or in the set of legal track patterns.

For example, the method or system may identify shapes whose geometries violate, for example, the minimum length rule that require a wire segment to have at least the minimum length. It should be noted that the checking or verification manipulates various shapes in the electronic design and thus may or may not distinguish wire segments from vias and pins. As another example, the method or system may identify a shape with a specific width that does not correspond to any tracks in the recognized or legal track patterns. Upon the identification of at least one non-conforming shape, the method or system may then determine whether or not a first shape changes the non-conforming shape into a conforming shape that corresponds to a recognized shape in one or more existing or legal track patterns at 308.

The method or system may also determine whether a second shape resolves a violation caused by the non-conforming shape at 310. For example, a non-conforming wire shape may have width that is not recognized as any of the permissible or legal widths for wire segments or may have a length failing to meet the minimum length rule for wire segments. Nonetheless, another shape may overlap or border the non-conforming shape in such a way that the combined shape now has a permissible or legal width found in one or more track patterns. If the method or system identifies such a first shape at 308 or a second shape at 310, the non-conforming shape will not be flagged as error. At 312, the method or system may also dynamically check or verify new shapes that are added or to be added into or removed or to be removed from the electronic design in identical or substantially similar manner as those described for 208 of FIG. 2. In these embodiments, the checks or verification of a shape may be performed either after the fact after the shape has been added to or removed from the electronic design, at the time the shape is being added to or removed from the electronic design, or even before the shape is added to or removed from the electronic design.

Figure 4A:
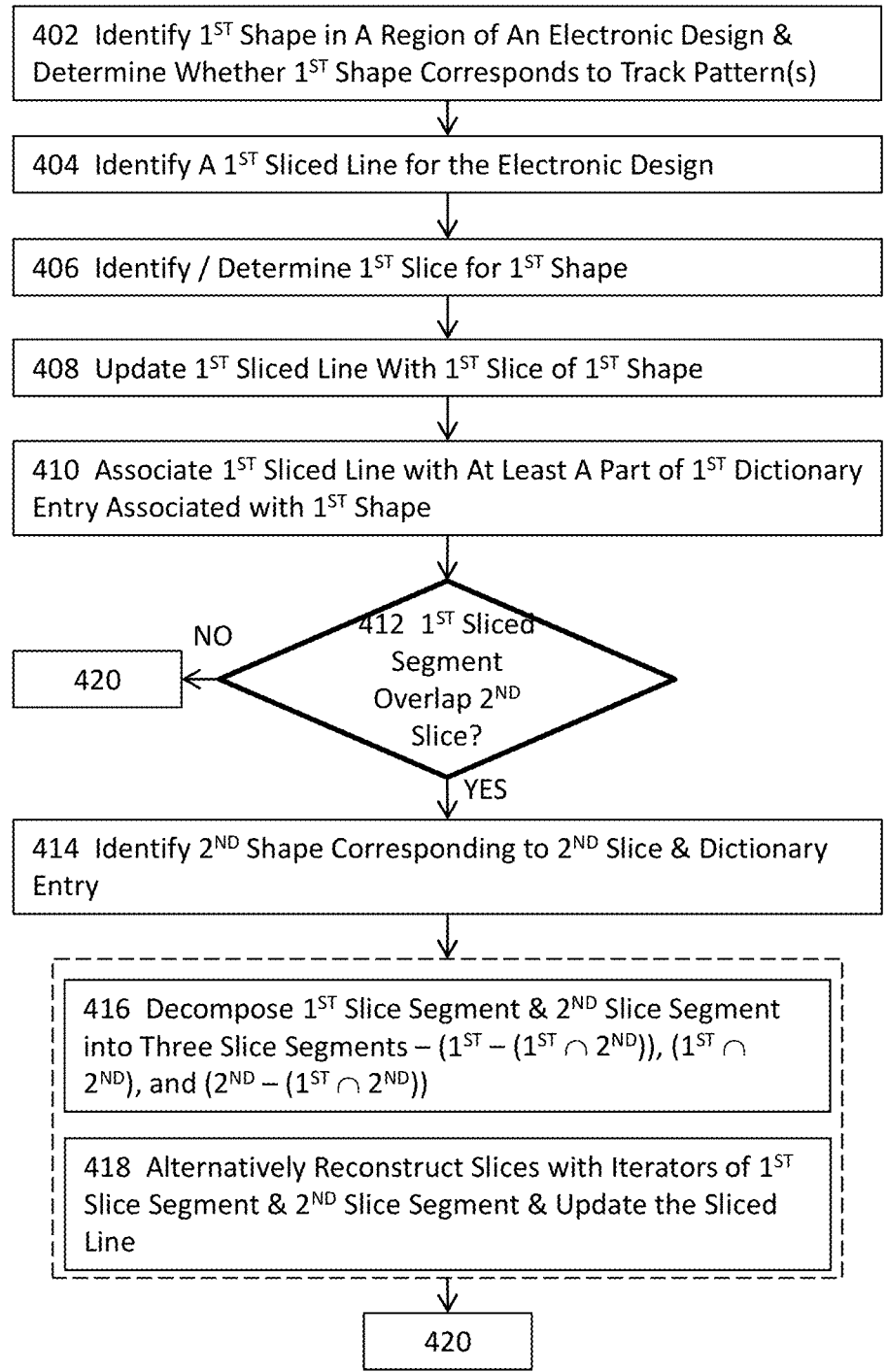
FIGS. 4A-C jointly illustrate a more detailed flow diagram for a process or module for checking or verifying shapes associated with track patterns for electronic circuit designs in some embodiments.
Figure 4B:
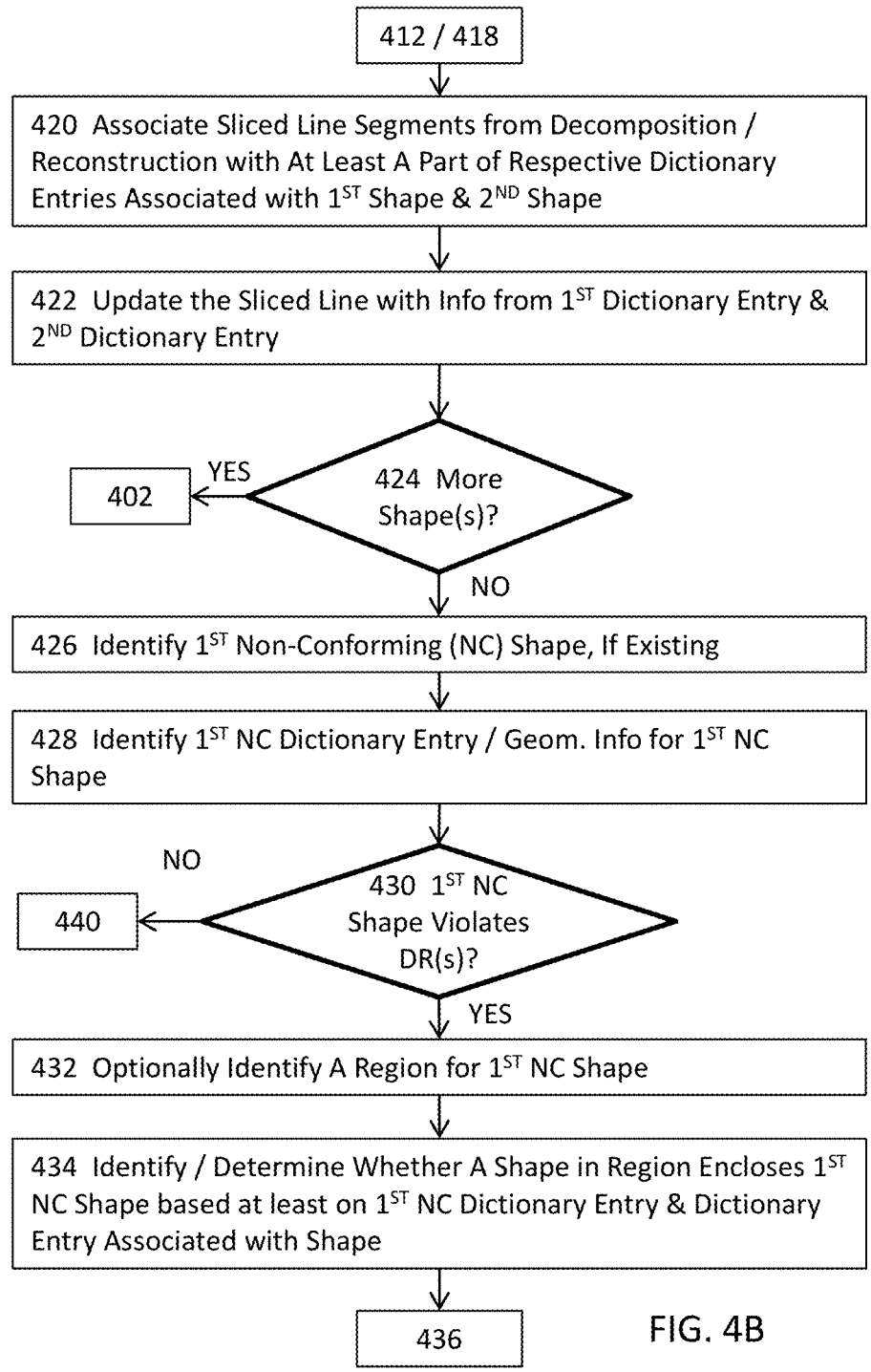
Figure 4C:
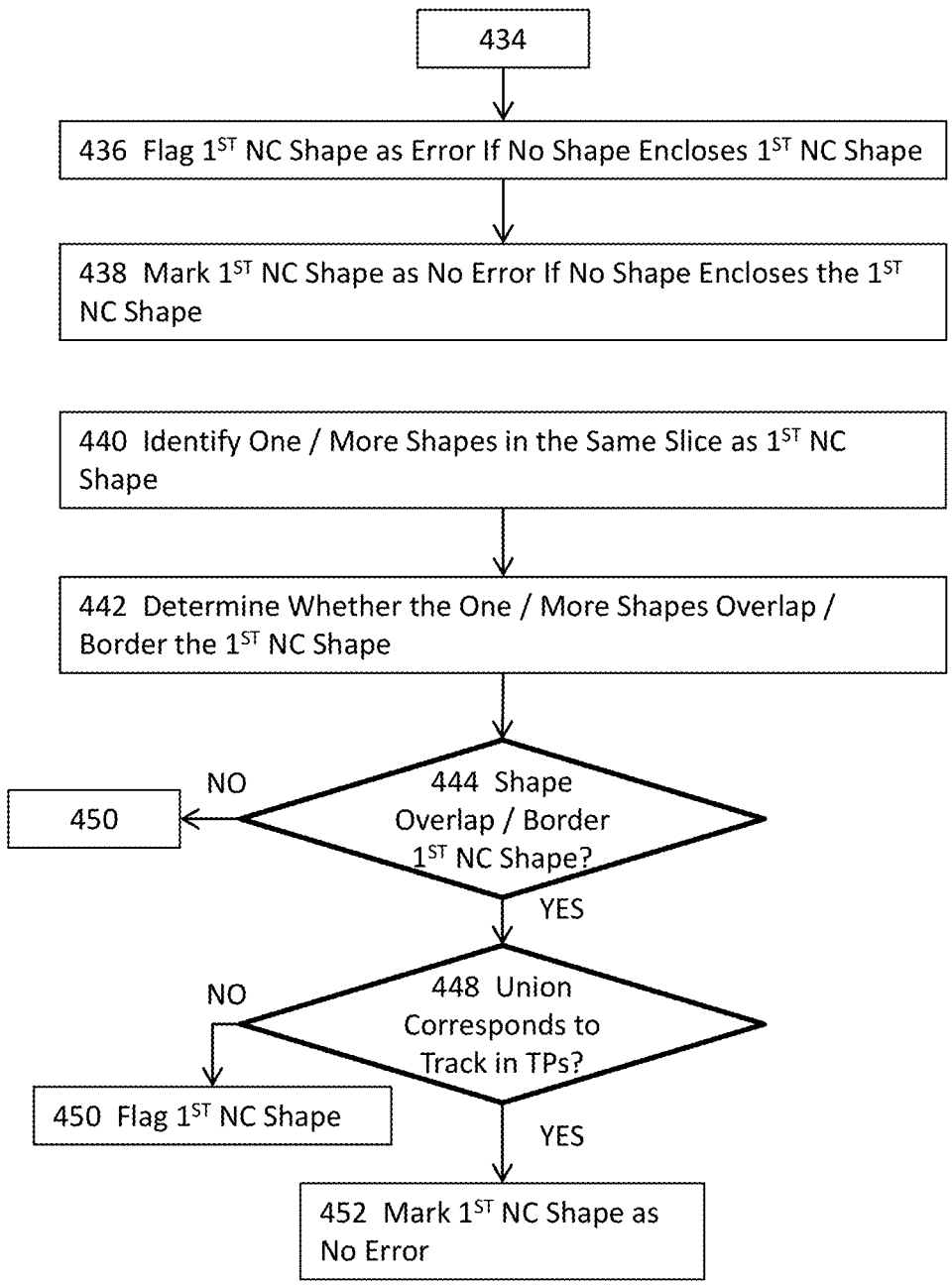

FIGS. 4A-C jointly illustrate a more detailed flow diagram for a process or module for checking or verifying shapes associated with track patterns for electronic circuit designs in some embodiments. In these embodiments illustrated in FIGS. 4A-C, the method or system may identify a first shape in 402 and its corresponding first sliced line in a region of the electronic design at 404. The method or system may further determine whether the first shape corresponds to any shapes in one or more track patterns at 402. If the method or system identifies that the first shape does not correspond to any shape in any track patterns, wire patterns, or shape patterns, the first shape is determined to be a non-conforming shape because it does not correspond to any recognized or legal shape. For example, the method or system may identify the top period line or the bottom period line as the sliced line in the area of a cell, a block, or an area of an electronic design at 404.

The method or system may then identify or determine a first slice or a first sliced line segment on the sliced line for the first shape at 406. In some of these embodiments, the method or system may identify or determine the first slice or the first sliced line segment on the sliced line for the first shape by partitioning the region of interest via snapping a line to each of an end of the first shape. The slice may thus include the area enclosed by these two lines and the other two boundary segments of the region. At 408, the method or system may update the first sliced line with the first slice or the first sliced line segment on the sliced line of the first shape. In some of these embodiments, the method or system may update the first sliced line by projecting the ends of the first shape onto the sliced line.

The method or system may then update the sliced line by determining a first sliced line segment along the sliced line. By identifying or determining a sliced line segment for a shape, the method effectively transformed the more complex two-dimensional geometric data into simpler one-dimensional geometric data. At 410, the method or system may associate a first dictionary entry of the first shape with the first slice, the first sliced line segment, or the first sliced line with reference to the first slice. The first dictionary entry associated with the first shape may include, for example, geometric information of the first shape, a collection of wire patterns or track patterns that the first shape may correspond to, or any other appropriate information of the first shape in some embodiments. The geometric information may include, for example, the width of the first shape, the absolute or relative distance of the first shape with respect to a reference line (e.g., a period line), etc. The distance of a shape to a reference line may be the shortest distance between the reference line and an edge, a center line, or a bisect of the shape.

At 412, the method or system may determine whether the first sliced segment overlap a second sliced segment corresponding to a second shape. If the determination result is affirmative at 412, the method or system may further identify the second shape corresponding to the second shape and the dictionary entry associated with the second entry at 414. The second sliced segment may be identified or determined similarly by projecting two ends of the second shape onto the sliced line and forming the second sliced segment by using the two projected end points of the second shape on the sliced line. The method may further associate the send dictionary entry for the second shape with the second sliced line segment. The method or system may decompose the first slice segment and the second slice segment into three slice segments by performing the following operations:

$$(1^{ST}-(1^{ST}\cap 2^{ND})), (1^{ST}\cap 2^{ND}) \text{ and} \quad (1)$$

$$(2^{ND}-(1^{ST}\cap 2^{ND})) \quad (2)$$

That is the method or system forms a third sliced line segment for the intersection $((1^{ST}\cap 2^{ND}))$ of the first sliced line segment and the second sliced line segment, and the original first sliced line segment and the second sliced line segment may be modified at 416 by subtraction the intersection from the first sliced line segment and the second sliced line segment, respectively. In the alternative, the method or system may decompose the sliced line by identifying the respective start iterators and the end iterators of the first and the second sliced line segments and determining the three sliced line segments using these four iterators at 418. The method or system may then associate the sliced line segments from the decomposition or reconstruction at 418 with at least a part of the respective dictionary entries associated with the first shape and the second shape at 420.

At 422, the method or the system may update the sliced line with the information from the first dictionary entry and the second dictionary entry.

For example, if the original first sliced line segment and the original second sliced line segment are respectively associated with the track patterns $\{P_1, P_2\}$ and $\{P_2, P_3\}$, the modified first sliced segment (by subtracting the intersection of the first and the second sliced line segments from the first sliced line segment) may still be associated with the track patterns $\{P_1, P_2\}$; the modified sliced line segment may be associated with the track patterns $\{P_2, P_3\}$; and the newly determined sliced line segment (the intersection of the first and the second sliced line segments) may be associated with $\{P_1, P_2\} \cap \{P_2, P_3\} = \{P_2\}$ at 420 and 422. At 424, the method or system further determines whether there are more shapes to process. If the determination result is affirmative, the method or system may return to 402 and repeat the processes 402-422 until all the shapes have been processed.

The actions described in 402-422 demonstrate an illustrative process or module for identifying or determining a sliced line for an electronic design such as 304 of FIG. 3. At 426-438, the method or system may determine whether a shape in a recognized or legal track pattern may resolve a design rule check (DRC) violation for a non-conforming shape that violates one or more design rules such as the process or module 310 of FIG. 3. At 426, the method may identify a first non-conforming shape. A non-conforming shape is a shape that does not correspond to any recognized shape or legal shape in any recognized or legal track patterns, wire patterns, or shape patterns. Non-conforming shapes may include, for example, pins, pads, terminals, etc. (collectively pins) that constitute metal shapes but do not comply with design rules governing routed wire segments.

At 428, the method or system may identify a first non-conforming dictionary entry or geometric information for the first non-conforming shape. For example, the method or the system may identify $S_{NC1}$ for the first non-conforming shape, where $\{S_{NC1}, W_{NC1}\}$ indicates the spacing of the first non-conforming shape from a reference line (e.g., the period line), and $W_{NC1}$ indicates the width of the first non-conforming shape. At 430, the method or system may determine whether or not the first non-conforming shape violates one or more design rule. If the first non-conforming shape is determined not to violate any design rules other than being non-conforming to any recognized or legal shapes in track, wire, or shape patterns, the method or system may proceed to 440 which will be described later in the description of FIGS. 4A-C. Otherwise, the method or system may optionally identify a region for the first non-conforming shape at 432.

For example, the method or system may identify the slice corresponding to the first non-conforming shape which may be marked or labeled as error if the design rule violation cannot be resolved by subsequent processes. At 434, the method or system may identify or determine whether or not a shape near the first non-conforming shape or in the region optionally identified at 432 completely encloses the first non-conforming shape. In an example where the first non-conforming shape includes a pin, the method or system identifies or determines whether the pin is completely enclosed or covered by another recognized or legal shape at 434.

At 436, the method or system flag the first non-conforming shape as an error if no other recognized or legal shapes in the vicinity of the first non-conforming shape completely encloses the first non-conforming shape. Otherwise, the method or system may mark or label the first non-conforming shape as no error at 438 if at least one recognized shape completely encloses the first non-conforming shape. If the first non-conforming shape is determined, at 430, not to violate any design rules other than being non-conforming to any recognized or legal shapes in track, wire, or shape patterns, the method or system may proceed to 440.

440-452 describe the processes or modules that determine whether a recognized shape in the region changes a non-conforming shape into a shape that corresponds to one or more recognized or legal track, wire, or shape patterns. At 440, the method or system may identify one or more shapes in the same slice as the first non-conforming shape. At 440, the method or system may identify one or more shapes in the same slice as the first non-conforming shape. In some embodiments where a shape is associated with its width and distance from a reference line in, for example, the data dictionary, the method or system may identify these one or more shapes based at least in part on their associated widths and distances.

At 442, the method or system may determine whether or not the one or more shapes identified at 440 overlap or borders the first non-conforming shape. In the above example where a shape is associated with its width and distance, the method or system may determining whether a shape is overlapping or bordering the first non-conforming shape based on the respective widths and distances of the shape and the first non-conforming shape. Therefore, various methods and systems use the one-dimensional sliced line segments to represent various shapes in a layout of an electronic design, the widths and distances associated with each shape and thus with each sliced line segment may be used to determine the position of the shape in the second dimension, without actually considering the two-dimensional data for any shapes. By using the one-dimensional sliced line segments and their respective associated data dictionary entries, various methods and systems may perform checks and verification for an electronic design much more quickly than conventional design rule check or verification with the same set of design rules, especially when the number of shapes is large.

Moreover, experimental results have demonstrated that the time for perform design rule checks or verification is almost linear with the number of shapes for design rule check or verification. If the one or more shapes are determined to overlap or border the first non-conforming shape, the method or system may further determine or identify the union of the one or more shapes and the first non-conforming shape and determine whether or not the union corresponds to a shape in one or more recognized or legal track, wire, or shape patterns at 448. If the determination result is affirmative, the method or system may then mark the first non-conforming shape as no error at 452. Otherwise, the method or system may flag the first non-conforming shape as an error or violation.

Figure 5:
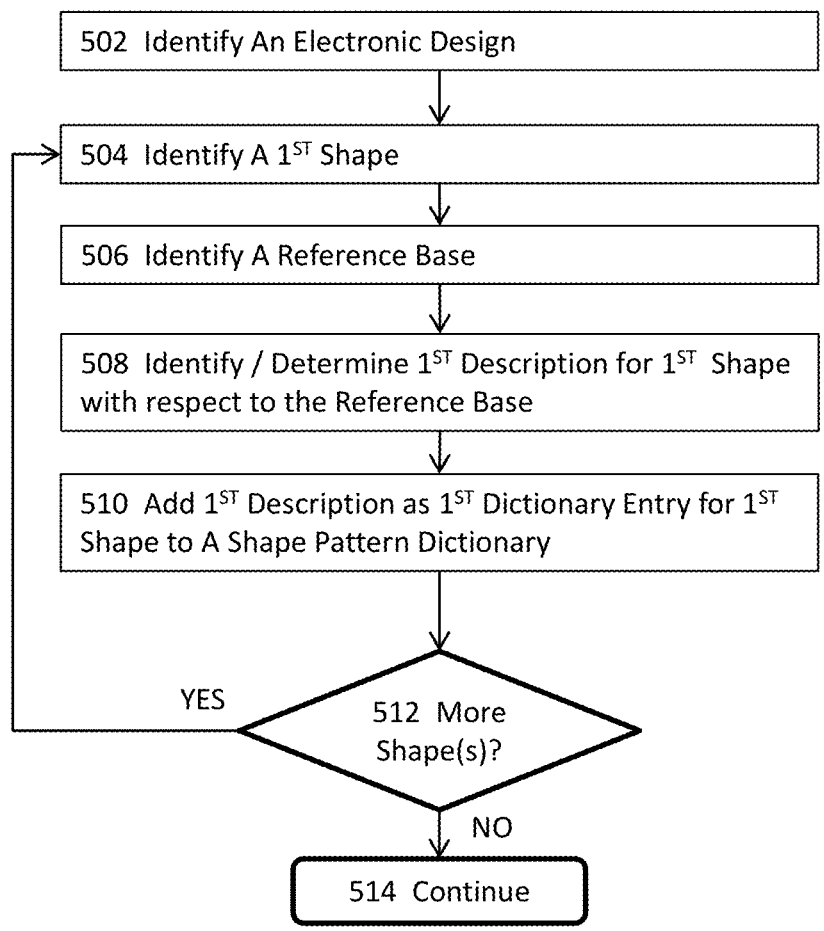
FIG. 5 illustrates another more detailed level flow diagram for a method or system for checking or verifying shapes associated with track patterns for electronic circuit designs in some embodiments.

FIG. 5 illustrates another more detailed level flow diagram for a method or system for checking or verifying shapes associated with track patterns for electronic circuit designs in some embodiments. In these embodiments illustrated in FIG. 5, the method or system may identify an electronic design at 502 and a first shape in the electronic design at 504. At 506, a reference base may be identified. The reference base may include, for example, a period line or a boundary segment of a region of interest in the electronic design along the routing direction in some embodiments. The method or system may identify or determine a first description for the first shape with respect to the reference base at 508.

The first description for the first shape may include the width of the first shape, the distance of the first shape from the reference base, information about or identification of one or more wire patterns or shape patterns including the first shape, or any other information related to the shape. In some embodiments, the information about or identification of one or more wire patterns or shape patterns may be expressed as a bitmask. For example, if the width or offset of a first shape may be found to be associated with a track in two patterns P1 and P2 of four permissible legal patterns $P_1$, $P_2$, $P_3$, and $P_4$, the first identification of patterns for the first shape may be expressed symbolically as {P1, P2} or in a bitmask {0, 0, 1, 1} where the first element "0" indicates that the width or offset of the first shape is not found in $P_4$, the second element "0" indicates that the width or offset of the first shape is not found in $P_3$, the third element "1" indicates that the width or offset of the first shape is found in pattern $P_2$, and the fourth element "1" indicates that the width or offset of the first shape is also found in pattern $P_1$.

At 510, the method or system may add the first description as the first dictionary entry for the first shape to a shape or pattern dictionary. At 512, the method or system determines whether or not there are more shapes to process. If the determination result is affirmative, the method or system may return to 504 and repeat 504-512 until all the shapes are processed. Otherwise, the method or system may proceed to 514 to continue with other processes or modules such as design rule check or verification for the electronic design.

Figure 6A:
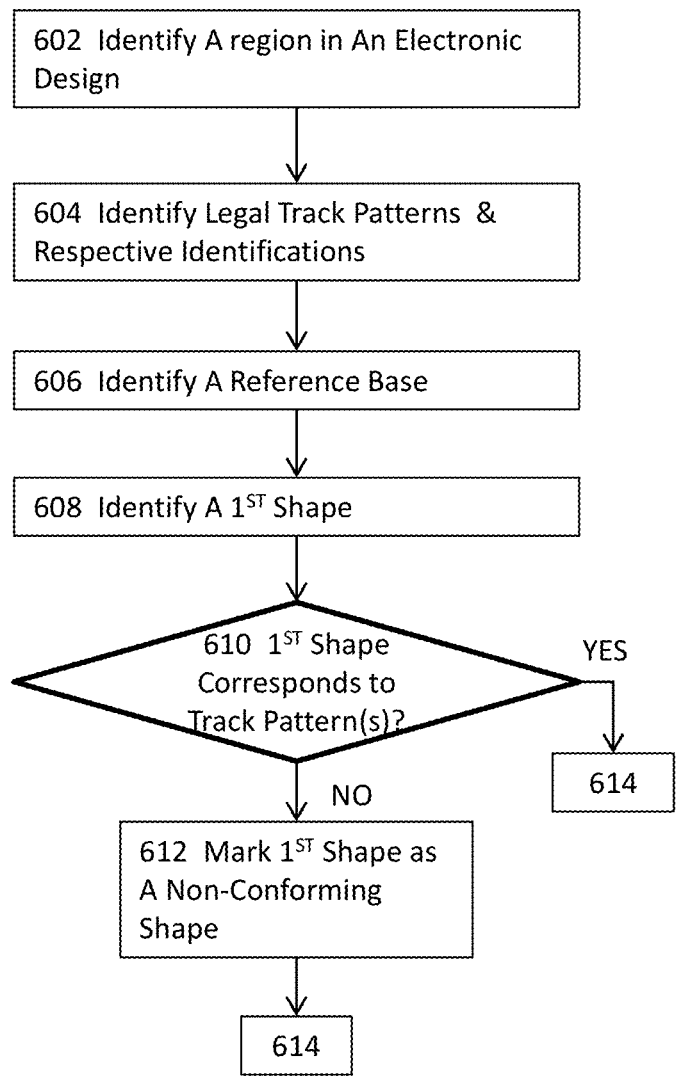
FIGS. 6A-B jointly illustrate another more detailed level flow diagram for a process or module for checking or verifying shapes associated with track patterns for electronic circuit designs as illustrated in FIG. 3 in some embodiments.
Figure 6B:
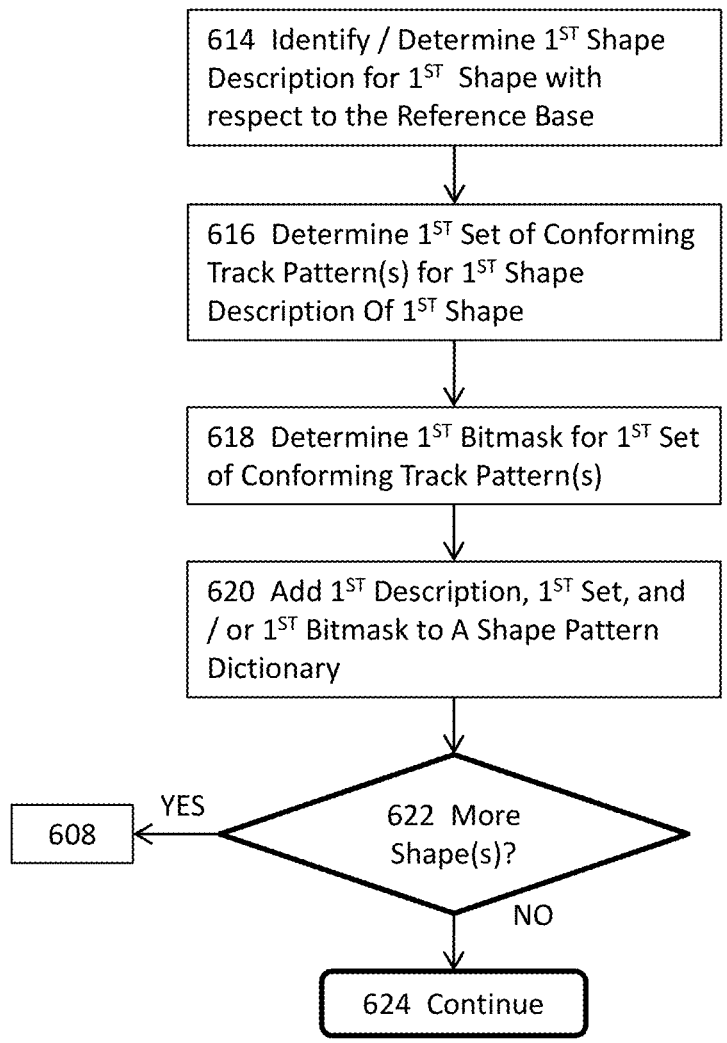

FIGS. 6A-B illustrate another more detailed level flow diagram for a process or module for checking or verifying shapes associated with track patterns for electronic circuit designs as illustrated in FIG. 3 in some embodiments. More specifically, FIGS. 6A-B illustrate a more detailed flow diagram for generating or updating a shape or pattern dictionary. In these embodiments illustrated in FIGS. 6A-B, the method or system may identify a region electronic design at 602 and identify a set of legal track patterns at 604. A region may include a cell, a block, an area, or an instance thereof in the electronic design. In some of these embodiments, the method or system may further identify or create a unique identification for each of the legal track patterns.

For example, distinct patterns may be identified as $P_1$, $P_2$, $P_3$, . . . , etc. At 606, the method or system may identify a reference base for the region. A reference base may include, for example, a period line of the region in the direction of the routing direction. The method or system may identify a first shape in the region at 608 to determine the dictionary entry for. At 610, the method may identify or determine whether the first shape corresponds to one or more track patterns. In some embodiments, the method or system may identifying such a track pattern if the width of the first shape matches a width or offset associated with a track in the track pattern.

If the determination result is affirmative, the method or system proceeds to 614. Otherwise, the method or system may mark or label the first shape as a non-conforming shape, which may be further processed by various processes such as those in FIGS. 4A-C. At 614, the method or system may identify or determine a first shape description for the first shape with respect to the reference base. The first shape description may include any geometric information that relates to one or more sides of the first shape parallel to the reference base. As the example illustrated in FIG. 8A, the first shape 802 runs in a horizontal direction. The bottom period line may be identified as the reference base (e.g., a separate sliced line) that is shown as a separate line for clarity purposes.

The first shape description of the first shape may include the width of shape 802 and the distance from the top or bottom boundary segment of shape 802 to the reference base in some embodiments. The first shape description of the first shape may include the width of shape 802 and the distance from the centerline of shape 802 to the reference base in some other embodiments. The first shape description of the first shape may include the distance from the upper boundary segment and the distance from the lower boundary segment of 802 to the reference base 850 in some embodiments. At 616, the method or system may identify or determine the first set of one or more conforming track patterns or identifications of the one or more track patterns for the first shape description of the first shape.

A conforming track pattern includes a track pattern having one or more tracks, and the width associated with at least one of the one or more track matches that of the first shape. At 618, the method or system may optionally determine a first bitmask for the first set of one or more conforming track patterns for the first shape. For example, if the width or offset of the first shape may be found in two patterns P1 and P2 of four permissible legal patterns $P_1$, $P_2$, $P_3$, and $P_4$, the first identification of patterns for the first shape may be expressed symbolically as {P1, P2} or in a bitmask {1, 1, 0, 0} where the first element "1" indicates that the width or offset of the first shape is found in $P_1$, the second element "1" indicates that the width or offset of the first shape is found in $P_2$, the third element "0" indicates that the width or offset of the first shape is not found in pattern $P_3$, and the fourth element "0" indicates that the width or offset of the first shape is also not found in pattern $P_4$.

At 620, the method or the system may add the first shape description, the identifications of the one or more conforming track patterns, or the corresponding bitmask as a dictionary entry to the shape or pattern dictionary. At 622, the method or system may determine whether there are more shapes to process. If the determination result is affirmative, the method or system may return to 608 to identify the next shape for process and repeat 608-622 until all the shapes in the region have been processed. Otherwise, the method or system may continue at 622 with, for example, the design rule check or verification process.

Figure 7:
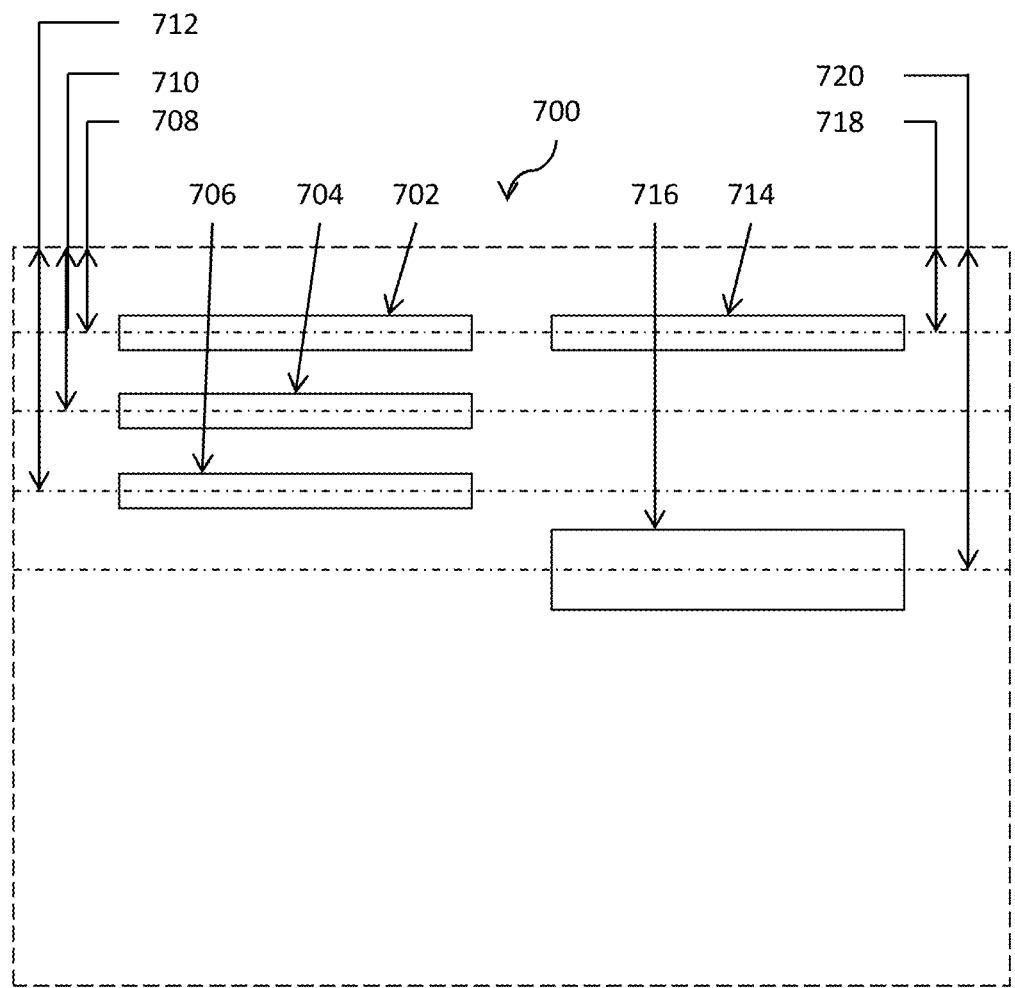
FIG. 7 illustrates an illustrative portion of a simplified electronic design to which a method or system for checking or verifying shapes associated with track patterns applies in some embodiments.

FIG. 7 illustrates an illustrative portion of a simplified electronic design to which a method or system for checking or verifying shapes associated with track patterns applies in some embodiments. In these embodiments illustrated in FIG. 7, a region 700 includes shapes 702, 704, 706, 714, and 716. Each of the five shapes includes its respective shape description. For example, the first shape 702 may be associated with first shape description including a first width, $W_1$, and the distance 708 from the centerline of the first shape 702 to a reference base—the top period line.

Similarly, the second shape 704 may be associated with second shape description including a second width, $W_2$, and the distance 710 from the centerline of the second shape 704 to a reference base; the third shape 706 may be associated with third shape description including a third width, $W_3$, and the distance 712 from the centerline of the third shape 706 to a reference base; the fourth shape 714 may be associated with fourth shape description including a fourth width, $W_4$, and the distance 718 from the centerline of the fourth shape 714 to a reference base; and the fifth shape 716 may be associated with fifth shape description including a fifth width, $W_5$, and the distance 720 from the centerline of the fifth shape 720 to a reference base. It shall be noted that the reference base needs not be the top period line of the region so long as the reference line may be selected to identify the geometric information of a shape to fully describe the shape in one direction. For example, the bottom period line may also be identified as the reference base in some embodiments.

In some other embodiments, the reference base needs not be in the routing direction. For example, the right or left period line may also be identified as the reference base. Moreover, the shape description does not necessarily have to include the width of a shape. For example, the first shape may still be fully described in the vertical direction by including the distance of the top edge to the reference base as well as the distance of the bottom edge to the reference base, without the width of the first shape.

Figure 8A:
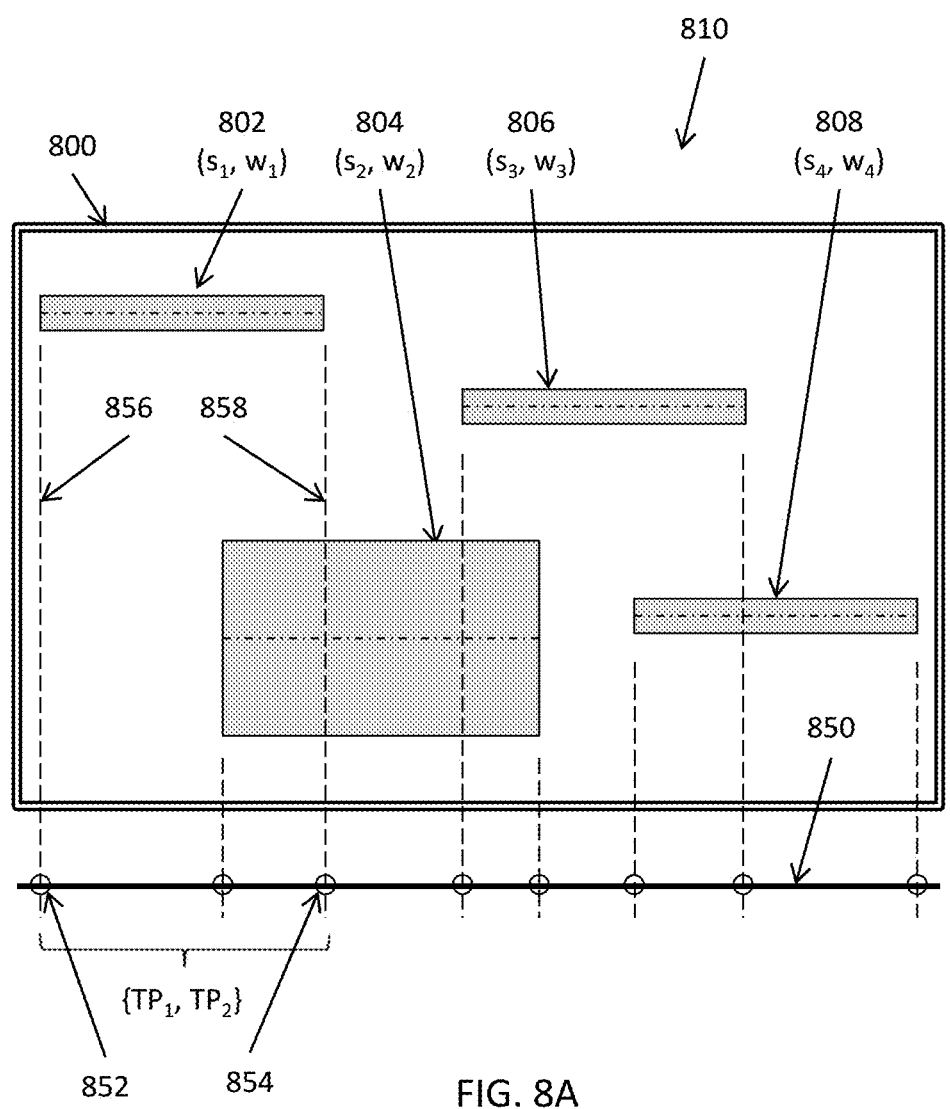
FIGS. 8A-H illustrates some illustrative applications of various processes or execution of modules for checking or verifying shapes associated with track patterns in electronic circuit designs in some embodiments.

FIGS. 8A-H illustrates some illustrative applications of various processes or execution of modules for checking or verifying shapes associated with track patterns in electronic circuit designs in some embodiments. FIG. 8A shows a block 810 enclosed with a boundary 800 in an electronic design including four shapes 802, 804, 806, and 808. Shape 802 is associated with the shape description $(S_1, W_1)$; shape 804 is associated with the shape description $(S_2, W_2)$; shape 806 is associated with the shape description $(S_3, W_3)$; and shape 808 is associated with the shape description $(S_4, W_4)$, where $W_i$ indicates the width of the shape, and $S_i$ indicates the distance or spacing value of the respective shape to the reference base 850—the sliced line. In FIG. 8A, a first slice is identified or determined by snapping two vertical lines or line segments 856 and 858 to the end points of shape 802 and includes the area between lines 856 and 858 as well as the top and bottom period lines.

The two end points of shape 802 are projected onto the sliced line as the start point 852 and the end point 854. The sliced line segment associated with shape 802 may thus be identified or determined as the line segment or vector from the start iterator 852 to the end iterator 854. Assuming that the width of shape 802 may be found to be associated with a track of two track patterns, $TP_1$ and $TP_2$. The identifications of these conforming track patterns may be added to the dictionary entry for shape 802. For example, the dictionary entry for shape 802 may include $\{TP_1, TP_2\}$. Therefore, the sliced line segment for shape 802 may also be associated the dictionary of shape 802.

Figure 8B:
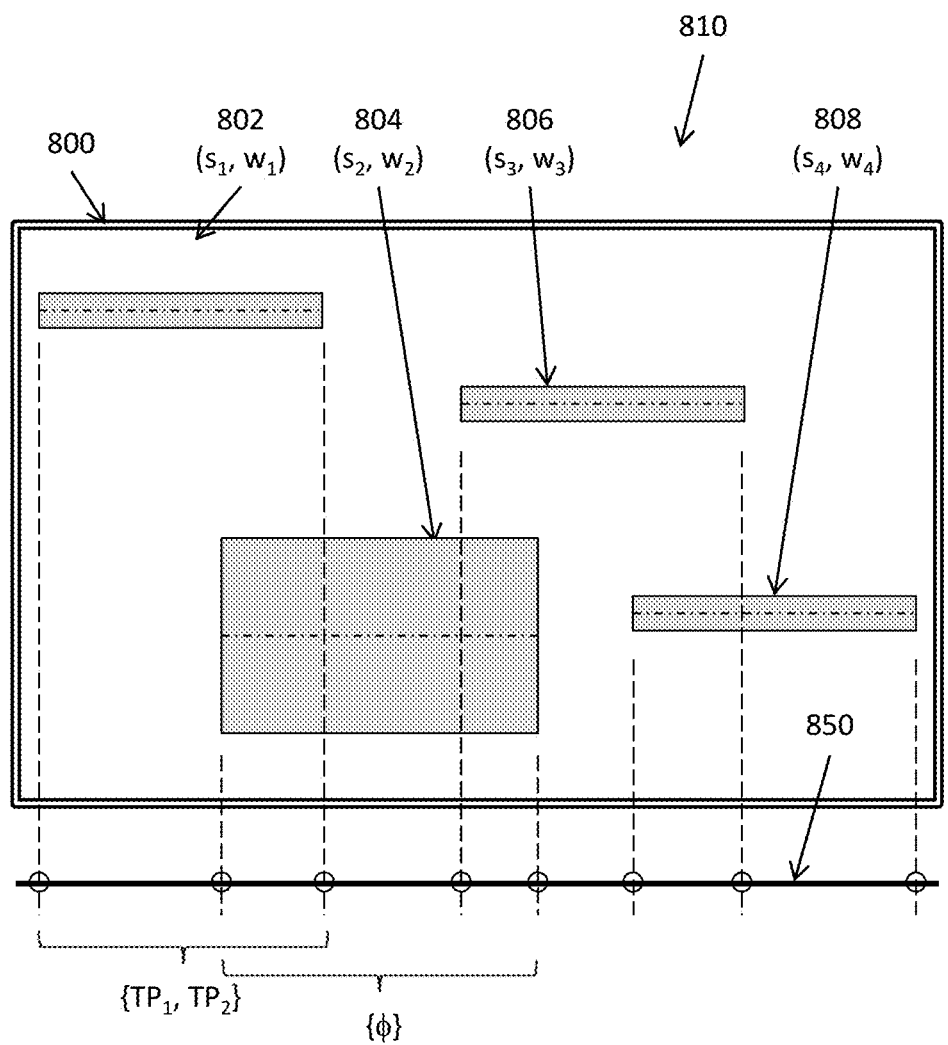
Figure 8C:
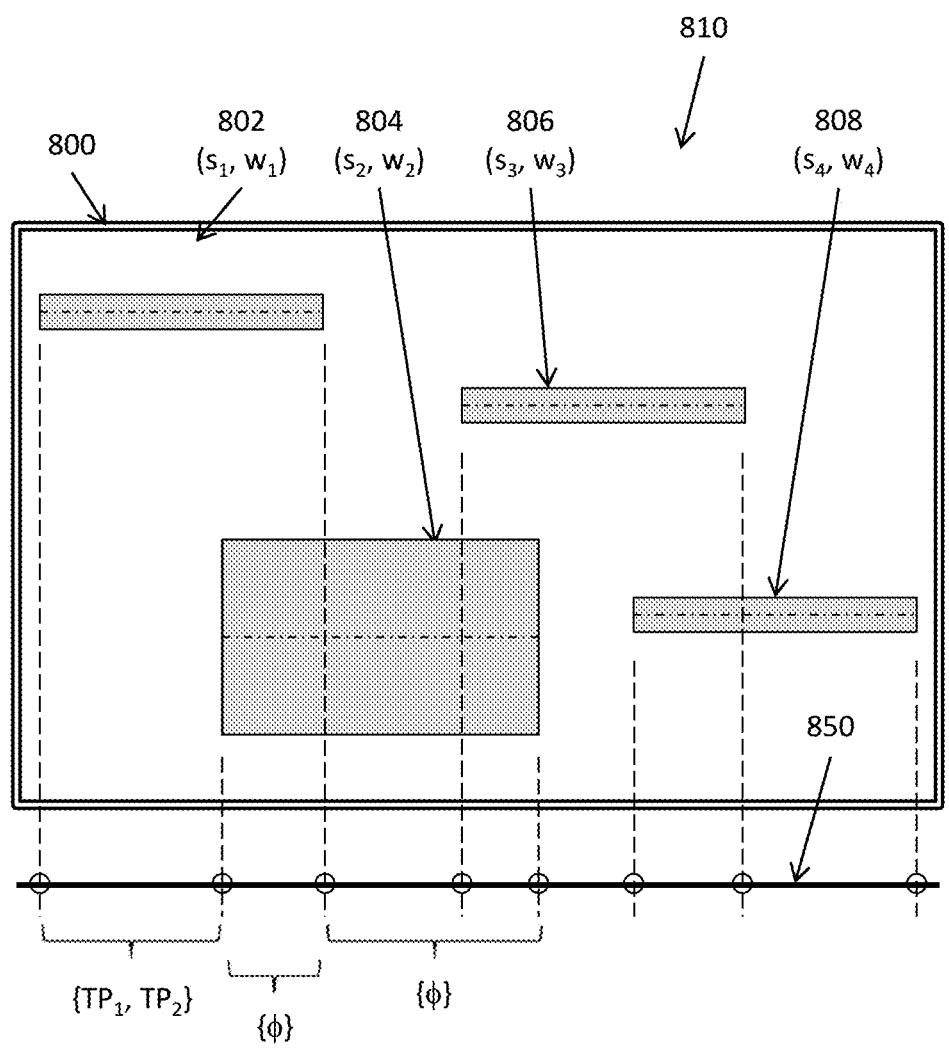

FIG. 8B illustrates that the method or system may further similarly process the second shape 804 to create a second sliced line segment on the sliced line 850. It is assumed that the width of shape 804 corresponds to no width values associated with any tracks in recognized or legal track patterns. Therefore, the dictionary entry for the set of conforming track patterns is an empty set as denoted in FIG. 8B. Consequently, the sliced line segment for shape 804 may thus be associated with the empty set from the dictionary entry for shape 804. FIG. 3C illustrates that the sliced line segment for shape 802 and the sliced line segment for shape 804 are further decomposed into three sliced line segments. The intersection of the sliced line segment for shape 802 and the sliced line segment for shape 804 as shown in FIG. 8C is associated with the empty set because $(\{PT_1, PT_2\} \cap \{\phi\}) = \{\phi\}$.

Figure 8D:
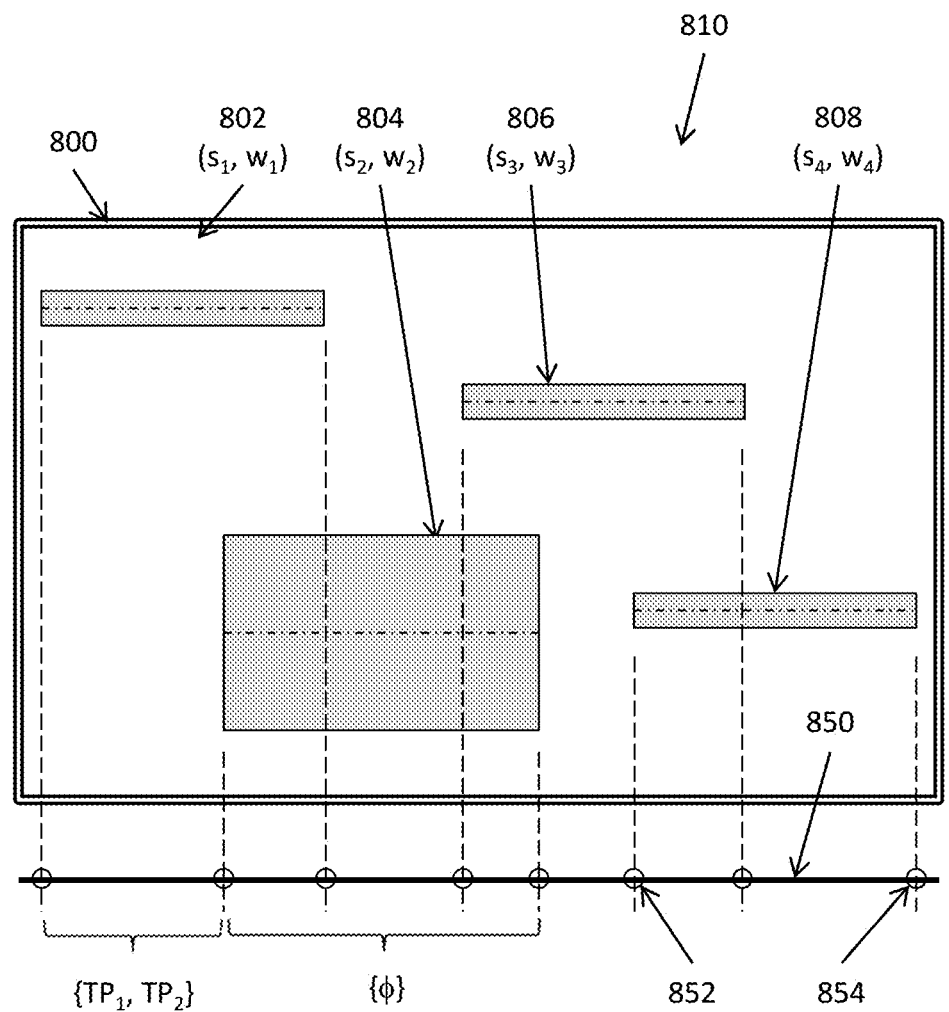

The modified sliced line segment for shape 804 remains associated the empty set $\{\phi\}$. The modified sliced line segment for shape 802 also remains associated with the data dictionary entry for shape 802—$\{PT_1, PT_2\}$. FIG. 8D illustrates merger of two similar sliced line segments. As it can be seen from FIG. 8C, both the modified sliced line segment for shape 804 and the sliced line segment corresponding to the intersection are similar in that both sliced line segments are associated with the empty set of track patterns. The method or system described herein may thus merge these two sliced line segments to form a longer sliced line segment associated with the empty set of track patterns as shown in FIG. 8D.

Figure 8E:
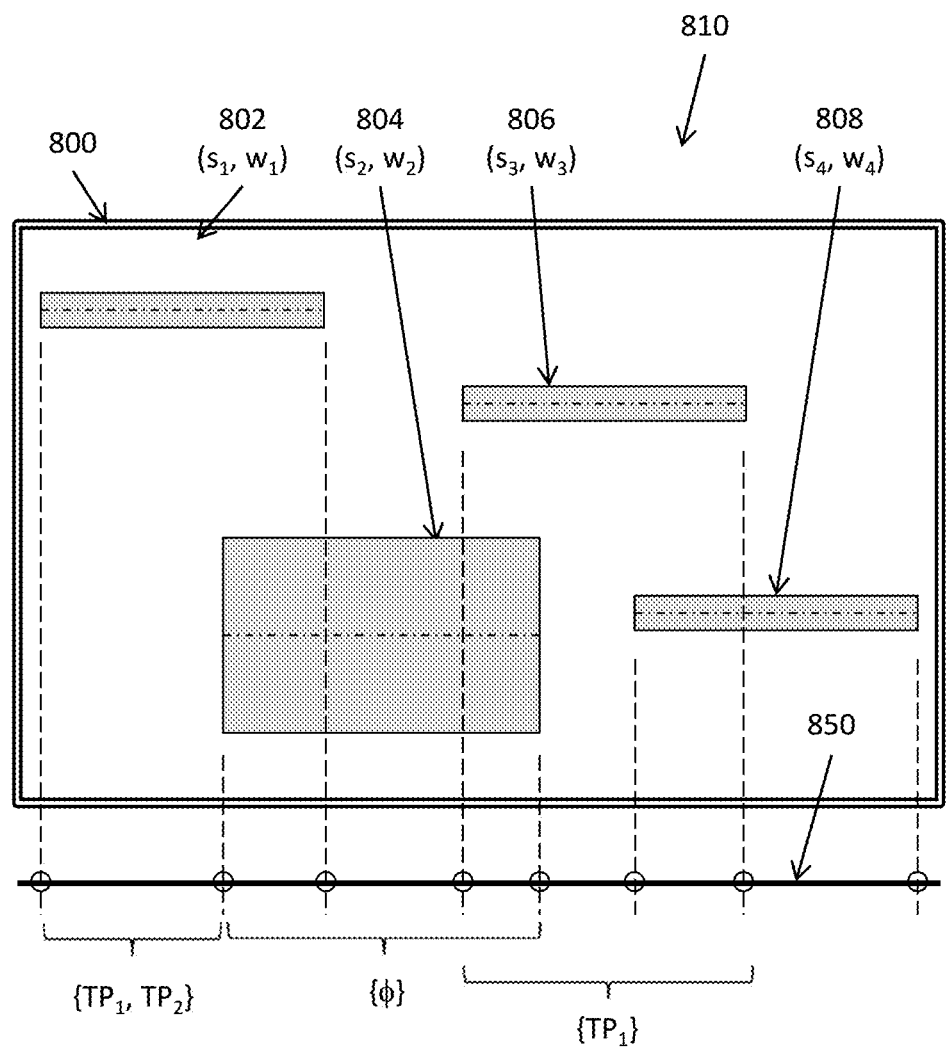
Figure 8F:
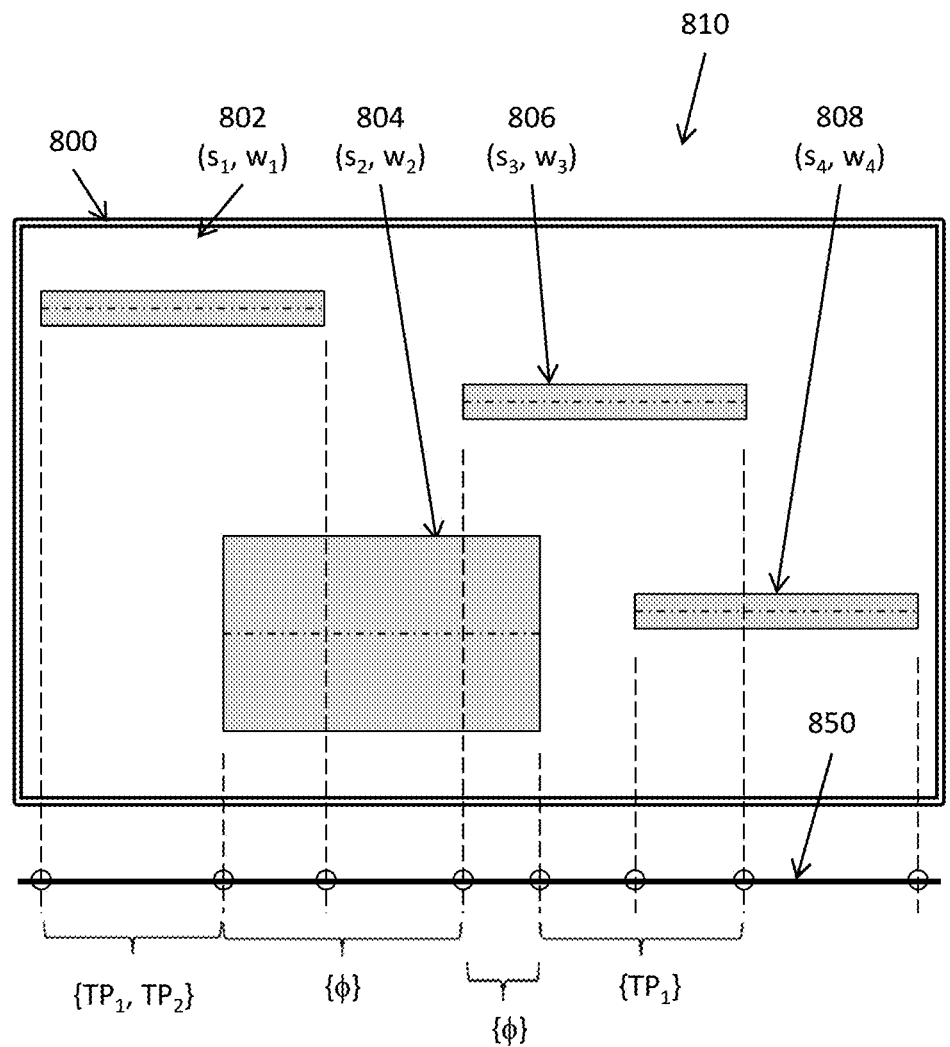

FIG. 8E further illustrates the identification or determination of another sliced line segment for shape 806. It is assumed that the width or offset of shape 806 may be found to be associated with a track in $TP_1$. Therefore, the newly formed sliced line segment may be associated with $\{TP_1\}$. FIG. 8F similarly illustrates the decomposition of the sliced line segment for shape 806 and the merged sliced line segment associated with the empty set. The intersection of the merged sliced line segment and the sliced line segment for shape 806 is thus associated with $(\{\phi\} \cap \{TP_1\}) = \{\phi\}$. The other two modified sliced line segments remain associated with their original track pattern identifications—$\{\phi\}$ and $\{TP_1\}$.

Figure 8G:
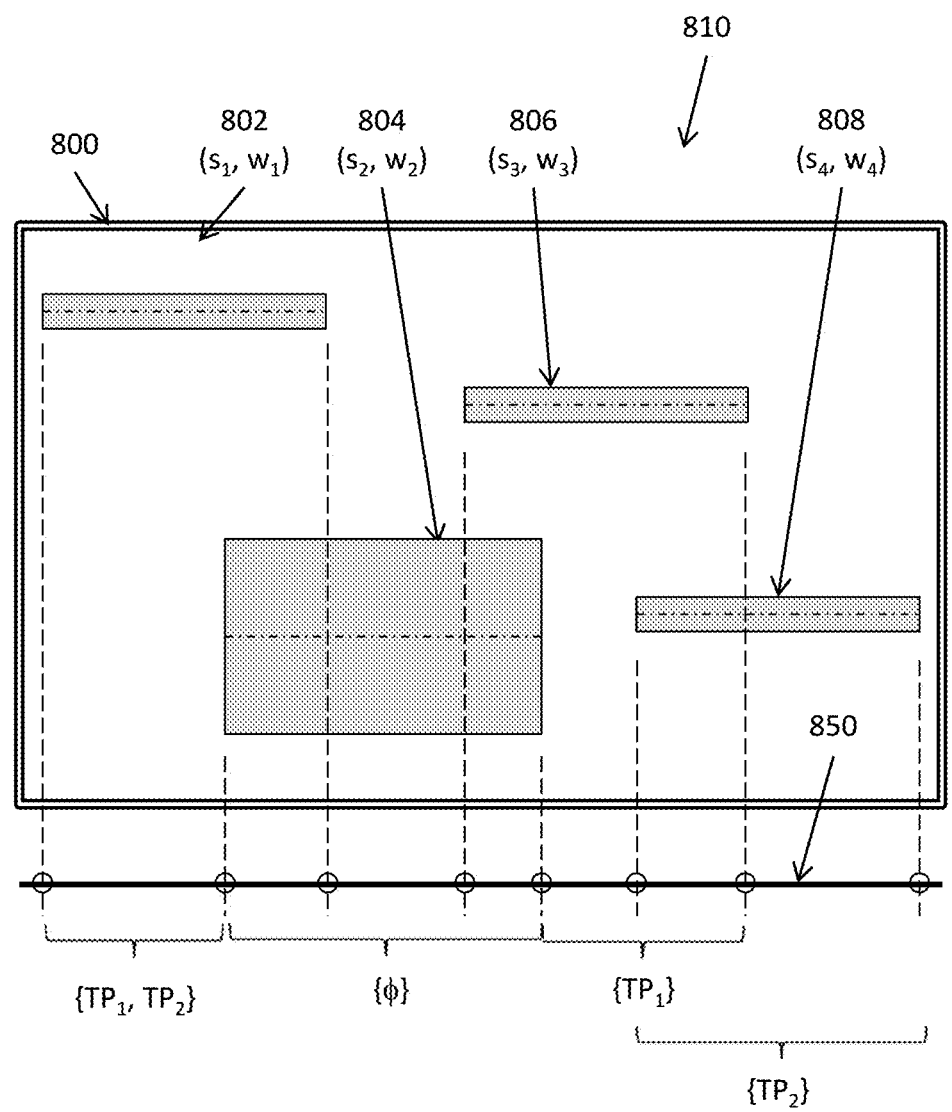
Figure 8H:
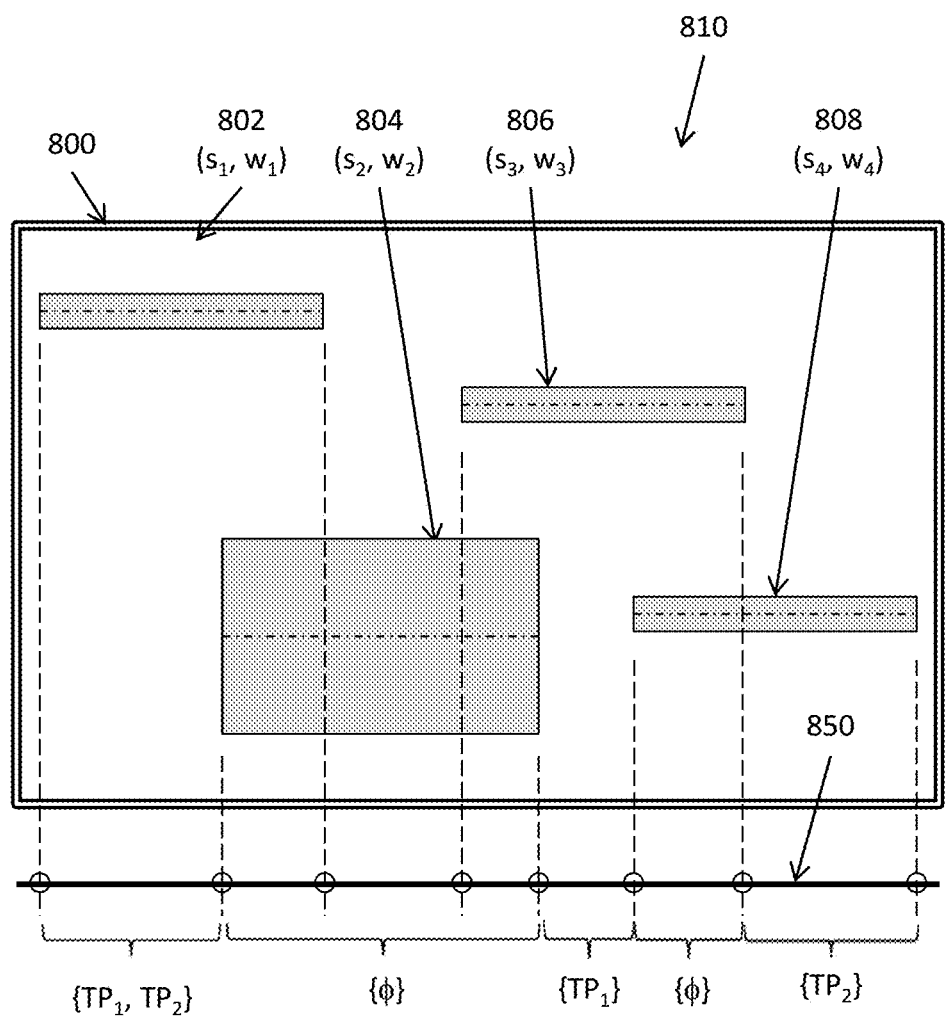

FIG. 8G illustrates the merger of two sliced line segments, each associated with the empty set. Therefore, the merged, longer sliced segment is thus associated with the empty set. FIG. 8G further illustrates the identification or determination of another sliced line segment for shape 808. It is assumed that the width $W_4$ of shape 808 may be found to be associated with $TP_2$. Therefore, the sliced line segment for shape 808 may be associated with $\{TP_2\}$ as illustrated in FIG. 8G. FIG. 8H illustrates the modification of two sliced line segments—the modified sliced line segment for shape 806 and the sliced line segment for shape 808. The intersection of these two sliced line segments is associated with an empty set of track patterns because $(\{TP_1\} \cap \{TP_2\}) = \{\phi\}$. The modified sliced line segment for shape 806 and the sliced line segment for shape 808 remain associated with their respective data dictionary entries—$\{TP_1\}$ and $\{TP_2\}$.

Figure 9:
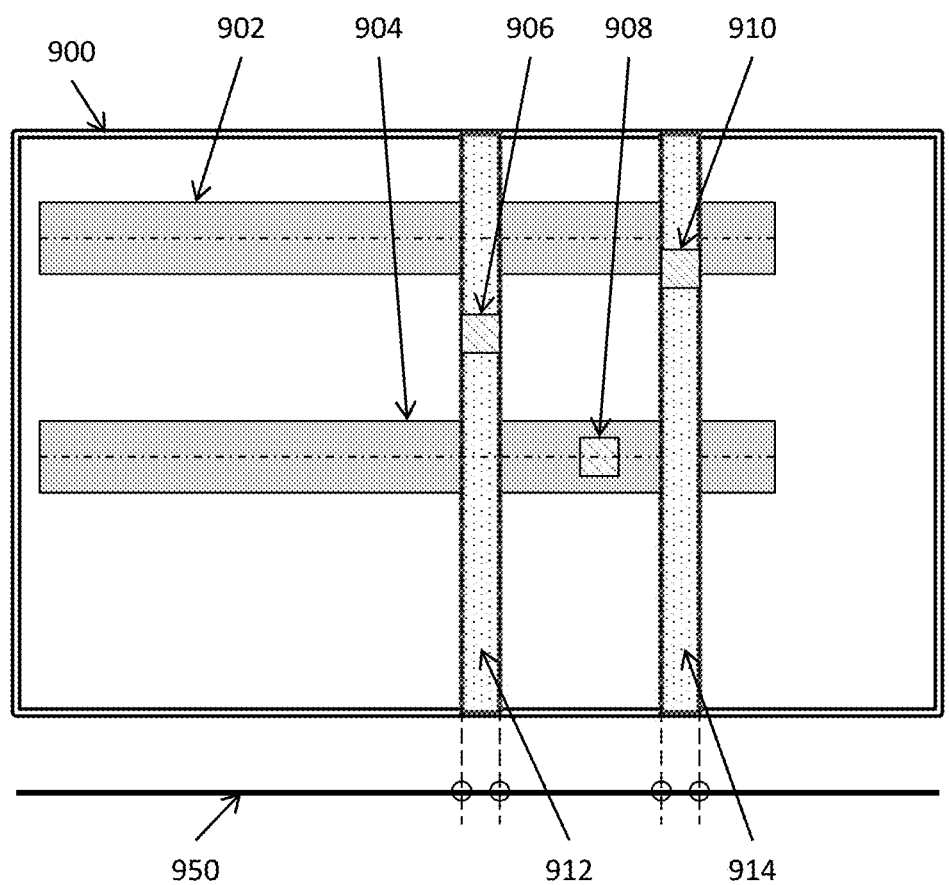
FIG. 9 illustrates an illustrative portion of an electronic design demonstrating some aspect of the method or system for checking or verifying shapes associated with track patterns in some embodiments.

FIG. 9 illustrates an illustrative portion of an electronic design demonstrating some aspect of the method or system for checking or verifying shapes associated with track patterns in some embodiments. More specifically, FIG. 9 illustrates a region 900 including three shapes—906, 908, and 910. These three shapes may include, for example, pins, pads, terminals, or any combinations thereof and thus violate at least the minimum length design rule requiring a metal interconnect to have at least the prescribed minimum length. It is assumed that the design rule check or verification modules do not exclude these three shapes from checking. By using various methods or systems described herein (e.g., those described with reference to FIGS. 4A-C), the method or system may determine whether another shape that corresponds to a recognized or legal track pattern fully encloses any of these three shapes and thus resolves the design rule violation.

For example, the method may identify a first shape 902 and determine that the first shape 902 does not completely enclose shape 910, although the first shape 902 overlaps shape 910. The method or system may thus flag shape 902 as an error or a DRC violation. Similarly, the method or system may determine that no other shapes corresponding to recognized or legal track patterns completely encloses shape 906 and thus may flag shape 906 as an error or a DRC violation. On the other hand, the method or system may identify the second shape 904 and determine that the second shape 904 completely encloses shape 908. As a result, the method or system may not flag shape 908 as an error or a DRC violation or may mark or label shape 908 as no error.

For the two flagged shapes 906 and 910, the method or system may further form respective slices shown as slices 912 and 914 and mark or label these two slices as having an error or a DRC violation. The method or system may also optionally project the respective end points of shapes 906 and 910 to a sliced line 950 to form two sliced line segments as shown in FIG. 9. It shall be note that in some of these embodiments illustrated in FIGS. 8-9, no Boolean operations are performed on any shapes at all. Rather, the DRC operations as well as various operations performed on sliced line segments involve only simple numeric or algebraic operations such as additions, subtraction, or direct copying of numbers.

Figure 10:
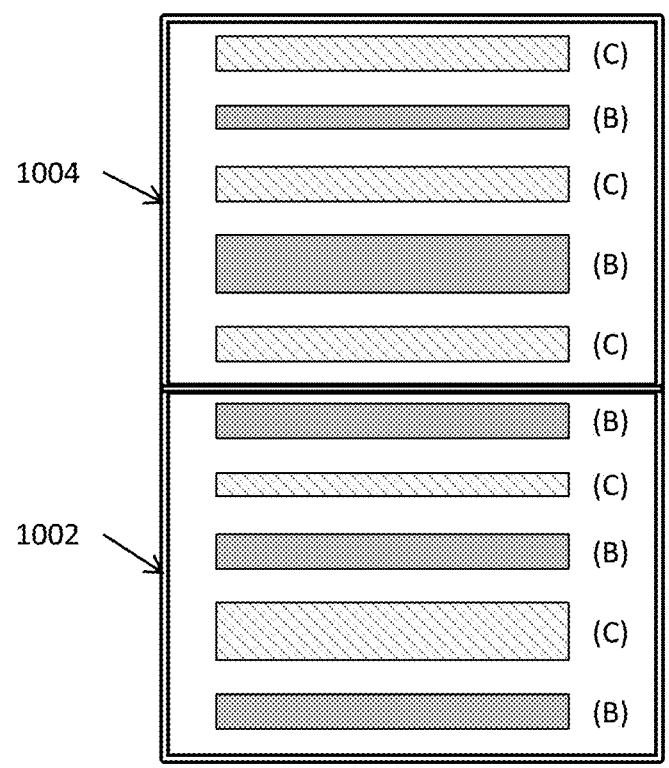
FIG. 10 illustrates an illustrative portion of an electronic design demonstrating some aspect of the method or system for checking or verifying shapes associated with track patterns in some embodiments.

FIG. 10 illustrates an illustrative portion of an electronic design demonstrating some aspect of the method or system for checking or verifying shapes associated with track patterns in some embodiments. It is assumed that the same pattern is to be repeated in two consecutive periods 1002 and 1004, and that the pattern includes five shapes having the photomask designations of {B, C, B, C, B} as shown in 1002 of FIG. 10. The problem is that directly copying the shape pattern in 1002 to 1004 will cause a color violation between the top shape of the pattern in 1002 and the bottom shape in 1004—two immediately adjacent shapes having the same photomask designation—{B}. The method or system described herein will identify that the pattern to be repeated contains an odd number of pattern and automatically flip the photomask designations of either the pattern in period 1002 or the pattern in period 1004 to resolve the color conflict between these two repeated patterns.

System Architecture Overview

Figure 11:
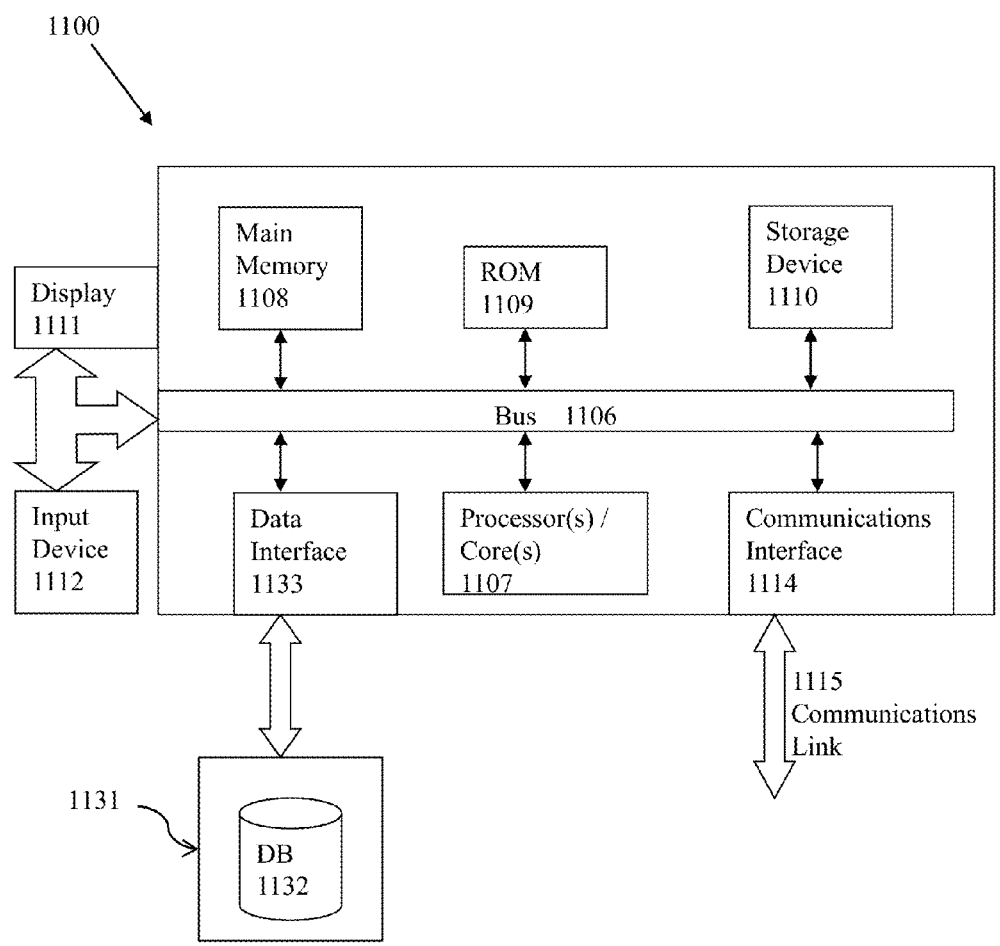
FIG. 11 illustrates a computerized system on which a method for checking or verifying shapes associated with track patterns for electronic circuit designs may be implemented.

FIG. 11 illustrates a block diagram of an illustrative computing system 1100 suitable for checking or verifying shapes associated with track patterns for electronic circuit designs as described in the preceding paragraphs with reference to various figures. Computer system 1100 includes a bus 1106 or other communication mechanism for communicating information, which interconnects subsystems and devices, such as processor 1107, system memory 1108 (e.g., RAM), static storage device 1109 (e.g., ROM), disk drive 1110 (e.g., magnetic or optical), communication interface 1114 (e.g., modem or Ethernet card), display 1111 (e.g., CRT or LCD), input device 1112 (e.g., keyboard), and cursor control (not shown).

According to one embodiment, computer system 1100 performs specific operations by one or more processor or processor cores 1107 executing one or more sequences of one or more instructions contained in system memory 1108. Such instructions may be read into system memory 1108 from another computer readable/usable storage medium, such as static storage device 1109 or disk drive 1110. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 1107, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout objects or nets are created or modified.

The term "computer readable storage medium" or "computer usable storage medium" as used herein refers to any medium that participates in providing instructions to processor 1107 for execution. Such a medium may take many forms, including but not limited to, non-volatile media and volatile media. Non-volatile media includes, for example, optical or magnetic disks, such as disk drive 1110. Volatile media includes dynamic memory, such as system memory 1108. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1100. According to other embodiments of the invention, two or more computer systems 1100 coupled by communication link 1115 (e.g., LAN, PTSN, or wireless network) may perform the sequence of instructions required to practice the invention in coordination with one another.

Computer system 1100 may transmit and receive messages, data, and instructions, including program, i.e., application code, through communication link 1115 and communication interface 1114. Received program code may be executed by processor 1107 as it is received, and/or stored in disk drive 1110, or other non-volatile storage for later execution. In an embodiment, the computer system 1100 operates in conjunction with a data storage system 1131, e.g., a data storage system 1131 that includes a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals that include data streams representing various types of signal information, e.g., instructions, messages and data. In embodiments of the invention, the functions of the data interface 1133 may be performed by the communication interface 1114.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for checking or verifying shapes in an electronic design, comprising:
using a computer system to execute a process, the process comprising:
identifying or determining a dictionary for an electronic design;
reducing, at a sliced line module stored at least partially in memory and including or function in conjunction with one or more microprocessors of the computer system, dimensionality of design data in a region at least by identifying or determining a first sliced line for the region in the electronic design, wherein the first sliced line includes one or more projected boundaries of the region; and checking or verifying the electronic design to identify one or more non-conforming shapes by using at least the first sliced line.

2. The computer implemented method of claim 1, the process further comprising:

dynamically checking or verifying a shape for compliance with design rules when the shape is being modified or before the shape is modified in the region based at least in part upon a user input by using at least the first sliced line; and presenting results of the compliance to a user in response to the user input.

3. The computer implemented method of claim 1, the process further comprising:

identifying a shape;

determining whether the shape corresponds to at least one track in multiple recognized or legal track patterns; and identifying the shape as a non-conforming shape when the shape is determined not to correspond to any tracks in the multiple recognized or legal track patterns.

4. The computer implemented method of claim 3, the process further comprising:

identifying a first shape in the region;

determining whether the first shape changes the non-conforming shape into a conforming shape that corresponds to the at least one track in the multiple recognized or legal track patterns; and determining whether to flag the non-conforming shape as a violation based at least in part upon a result of determining whether the first shape changes the non-conforming shape into the conforming shape.

5. The computer implemented method of claim 3, the process further comprising:

identifying a second track in the region;

determining whether or not the second shape resolves violations caused by the non-conforming shape; and determining whether to flag the non-conforming shape as a violation based at least in part upon a result of determining whether or not the second shape resolves violations caused by the non-conforming shape.

6. The computer implemented method of claim 1, the act of identifying or determine the first sliced line for the electronic design comprising:

identifying a first shape in the region of the electronic design;

determining whether the first shape corresponds to a track in one or more track patterns;

identifying or determining a first sliced line segment along the first sliced line for the first shape; and updating the first sliced line based at least in part upon the first sliced line segment.

7. The computer implemented method of claim 6, the act of identifying or determine the dictionary for the electronic design further comprising:

identifying or determining a second sliced line segment along the first sliced line for a first shape; and determining a modified first sliced line segment, a modified second sliced line segment, and an intersection sliced line segment for the first shape and the second shape from the first sliced line segment and the second sliced line segment.

8. The computer implemented method of claim 7, the act of identifying or determine the dictionary for the electronic design further comprising:

associating the modified first sliced line segment with a first data dictionary entry for the first shape;

associating the modified second sliced line segment with a second data dictionary entry for the second shape;

generating an intersection data dictionary entry by performing a set operation or a logic operation on the first data dictionary entry and the second data dictionary entry; and associating the modified first sliced line segment or the modified second sliced line segment with the intersection data dictionary entry.

9. The computer implemented method of claim 1, the process further comprising:

identifying a non-conforming shape from the one or more non-conforming shapes, wherein the one or more non-conforming shapes do not satisfy a requirement that requires respective widths of the one or more non-conforming shapes correspond to widths associated with tracks in recognized or legal track patterns;

determining whether or not the non-conforming shape violates a design rule; and determining whether a shape in the region resolves a violation of the design rule.

10. The computer implemented method of claim 9, wherein the shape resolves the error by completely encloses the non-conforming shape or by jointing the non-conforming shape to form a joined shape that satisfies the design rule.

11. The computer implemented method of claim 1, wherein the act of identifying or determining the dictionary comprises:

identifying a first shape in the region of the electronic design;

identifying or determining a first shape description for the first shape by using at least the first sliced line;

identifying or determining an identification of a first set of conforming track patterns for the first shape; and adding the first shape description or the identification of the first of conforming track patterns to a first data entry in the dictionary.

12. The computer implemented method of claim 11, wherein the act of identifying or determining the dictionary comprises at least one of:

identifying a set of track patterns for the electronic design;

determining whether the first shape corresponds to a track in at least one track pattern of the set of track patterns; and identifying or determining a bitmask for the identification for the first set of conforming track patterns for the first shape.

13. A system for checking or verifying shapes in an electronic design, comprising:

a computer system including at least a sliced line module stored at least partially in memory and functioning in conjunction with one processor or processor core that executes a sequence of instructions to:

identify or determine a dictionary for an electronic design;

reduce, at the sliced line module, dimensionality of design data in a region at least by identifying or determining a first sliced line for the region in the electronic design, wherein the first sliced line includes one or more projected boundaries of the region; and check or verify the electronic design to flag one or more non-conforming shapes by using at least the first sliced line.

14. The system of claim 13, wherein the computer system including at least one processor or processor core that further executes the sequence of instructions to:
identify a shape;
determine whether the shape corresponds to at least one track in multiple recognized or legal track patterns; and
identify the track as a non-conforming shape when the shape is determined not to correspond to any tracks in the multiple recognized or legal track patterns.

15. The system of claim 14, wherein the computer system including at least one processor or processor core that further executes the sequence of instructions to:
identify a first shape in the region;
determine whether the first shape changes the non-conforming shape into a conforming shape that corresponds to the at least one track in the multiple recognized or legal track patterns; and
determine whether to flag the non-conforming shape as a violation based at least in part upon a result of determining whether the first shape changes the non-conforming shape into the conforming shape.

16. The system of claim 14, wherein the computer system including at least one processor or processor core that further executes the sequence of instructions to:
identify a second track in the region;
determine whether or not the second shape resolves violations caused by the non-conforming shape; and
determine whether to flag the non-conforming shape as a violation based at least in part upon a result of determining whether or not the second shape resolves violations caused by the non-conforming shape.

17. The system of claim 13, wherein the at least one processor or processor core executing the sequence of instructions to identify or determine the first sliced line for the electronic design further executes the sequence of instructions to:
identify a first shape in the region of the electronic design;
determine whether the first shape corresponds to a track in one or more track patterns;
identify or determine a first sliced line segment along the first sliced line for the first shape; and
update the first sliced line based at least in part upon the first sliced line segment.

18. The system of claim 17, wherein the at least one processor or processor core executing the sequence of instructions to identify or determine the dictionary for the electronic design further executes the sequence of instructions to:
associate the modified first sliced line segment with a first data dictionary entry for the first shape;
associate the modified second sliced line segment with a second data dictionary entry for the second shape;
generate an intersection data dictionary entry by performing a set operation or a logic operation on the first data dictionary entry and the second data dictionary entry; and
associate the intersection sliced line segment with the intersection data dictionary entry.

19. The system of claim 13, wherein the at least one processor or processor core further executes the sequence of instructions to:
identify a non-conforming shape from the one or more non-conforming shapes, wherein
the one or more non-conforming shapes do not satisfy a requirement that require respective widths of the one or more non-conforming shapes correspond to widths associated with tracks in recognized or legal track patterns;
determine whether or not the non-conforming shape violates a design rule; and
determine whether a shape in the region resolves the error.

20. The system of claim 13, wherein the at least one processor or processor core executing the sequence of instructions to identify or determine the dictionary further executes the sequence of instructions to:
identify a first shape in the region of the electronic design;
identify or determine a first shape description for the first shape by using at least the first sliced line;
identify or determine an identification of a first set of conforming track patterns for the first shape; and
add the first shape description or the identification of the first of conforming track patterns to a first data entry in the dictionary.

21. An article of manufacture comprising a non-transitory computer accessible storage medium having stored thereupon a sequence of instructions which, when executed by at least one customizable processor executing one or more threads, causes the at least one customizable processor to perform a set of acts for checking or verifying shapes in an electronic design, the set of acts comprising:
using a computer system to execute a process, the process comprising:
identifying or determining a dictionary for an electronic design;
reducing, at a sliced line module stored at least partially in memory and including or function in conjunction with one or more microprocessors of the computer system, dimensionality of design data in a region at least by identifying or determining a first sliced line for the region in the electronic design, wherein the first sliced line includes one or more projected boundaries of the region; and
checking or verifying the electronic design to flag one or more non-conforming shapes by using at least the first sliced line.

22. The article of manufacture of claim 21, further comprising:
identifying a shape;
determining whether the shape corresponds to at least one track in multiple recognized or legal track patterns; and
identifying the shape as a non-conforming shape when the shape is determined not to correspond to any tracks in the multiple recognized or legal track patterns.

23. The article of manufacture of claim 22, the process further comprising:
identifying a first shape in the region;
determining whether the first shape changes the non-conforming shape into a conforming shape that corresponds to the at least one track in the multiple recognized or legal track patterns; and
determining whether to flag the non-conforming shape as a violation based at least in part upon a result of determining whether the first shape changes the non-conforming shape into the conforming shape.

24. The article of manufacture of claim 22, further comprising:
identifying a second track in the region;
determining whether or not the second shape resolves violations caused by the non-conforming shape; and determining whether to flag the non-conforming shape as a violation based at least in part upon a result of determining whether or not the second shape resolves violations caused by the non-conforming shape.

25. The article of manufacture of claim 21, the act of identifying or determine the first sliced line for the electronic design comprising:
  identifying a first shape in the region of the electronic design;
  determining whether the first shape corresponds to a track in one or more track patterns;
  identifying or determining a first sliced line segment along the first sliced line for the first shape; and
  updating the first sliced line based at least in part upon the first sliced line segment.

26. The article of manufacture of claim 25, the act of identifying or determine the dictionary for the electronic design further comprising:
  associating the modified first sliced line segment with a first data dictionary entry for the first shape;
  associating the modified second sliced line segment with a second data dictionary entry for the second shape;
  generating an intersection data dictionary entry by performing a set operation or a logic operation on the first data dictionary entry and the second data dictionary entry; and
  associating the modified first sliced line segment or the modified second sliced line segment with the intersection data dictionary entry.

27. The article of manufacture of claim 21, the process further comprising:
  identifying a non-conforming shape from the one or more non-conforming shapes, wherein
    the one or more non-conforming shapes do not satisfy a requirement that require respective widths of the one or more non-conforming shapes correspond to widths associated with tracks in recognized or legal track patterns;
  determining whether or not the non-conforming shape violates a design rule; and
  determining whether a shape in the region resolves the error.

28. The article of manufacture of claim 21, wherein the act of identifying or determining the dictionary comprises:
  identifying a first shape in the region of the electronic design;
  identifying or determining a first shape description for the first shape by using at least the first sliced line;
  identifying or determining an identification of a first set of conforming track patterns for the first shape; and
  adding the first shape description or the identification of the first of conforming track patterns to a first data entry in the dictionary.

* * * * *